US009006701B2

(12) United States Patent
Ito et al.

(10) Patent No.: US 9,006,701 B2
(45) Date of Patent: Apr. 14, 2015

(54) NON-VOLATILE MEMORY DEVICE HAVING BIT LINES AND SOURCE LINES ARRANGED IN PARALLEL AND MANUFACTURING METHOD THEREOF

(71) Applicant: Panasonic Intellectual Property Management Co., Ltd., Osaka (JP)

(72) Inventors: Satoru Ito, Hyogo (JP); Takumi Mikawa, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/054,538

(22) Filed: Oct. 15, 2013

(65) Prior Publication Data

US 2014/0138607 A1    May 22, 2014

(30) Foreign Application Priority Data

Oct. 15, 2012    (JP) ................................. 2012-228256

(51) Int. Cl.
*H01L 47/00* (2006.01)
*H01L 27/24* (2006.01)
*H01L 45/00* (2006.01)

(52) U.S. Cl.
CPC ............ *H01L 27/2436* (2013.01); *H01L 45/06* (2013.01); *H01L 45/1266* (2013.01); *H01L 45/146* (2013.01); *H01L 45/1625* (2013.01); *H01L 45/1675* (2013.01)

(58) Field of Classification Search
CPC ..................................................... H01L 45/00
USPC .............................................. 257/4; 438/382
See application file for complete search history.

(56) References Cited

U.S. PATENT DOCUMENTS 6,184,584 B1    2/2001  Sakao
7,459,715 B2 *  12/2008  Toda et al. .................. 257/2

(Continued)

FOREIGN PATENT DOCUMENTS

JP    11-297819 A    10/1999
JP    2004-349504 A    12/2004

(Continued)

*Primary Examiner* — Caleb Henry
(74) *Attorney, Agent, or Firm* — McDermott Will & Emery LLP

(57) ABSTRACT

A non-volatile memory device comprises first wires on and above a first plane; second wires extending in a direction crossing the first wires, on and above a second plane, third wires extending in parallel with the second wires on and above a fourth plane, and memory cells provided to correspond to three-dimensional cross-points of the first wires and the third wires, respectively, each of the memory cells including a transistor and a variable resistance element, the transistor including a first main electrode, a second main electrode, and a control electrode, the variable resistance element being placed on and above a third plane and including a lower electrode, an upper electrode and a variable resistance layer, wherein the upper electrode is connected to corresponding one of the third wires; and further comprises a first contact plug extending from the first main electrode to the second plane and connected to corresponding one of the second wires; a second contact plug extending from the second main electrode to the second plane; and a third contact plug extending from the second contact plug and connected to the lower electrode; wherein the second main electrode and the lower electrode are connected to each other via the second contact plug and the third contact plug.

19 Claims, 14 Drawing Sheets

(56) References Cited

U.S. PATENT DOCUMENTS

| | | | |
|---|---|---|---|
| 7,459,716 B2* | 12/2008 | Toda et al. | 257/2 |
| 7,750,334 B2* | 7/2010 | Toda | 257/2 |
| 7,884,346 B2* | 2/2011 | Mikawa et al. | 257/4 |
| 8,129,709 B2* | 3/2012 | Seko et al. | 257/5 |
| 8,198,618 B2* | 6/2012 | Mikawa et al. | 257/2 |
| 8,227,788 B2* | 7/2012 | Mikawa et al. | 257/4 |
| 8,253,136 B2* | 8/2012 | Mikawa et al. | 257/43 |
| 8,258,493 B2* | 9/2012 | Mikawa et al. | 257/1 |
| 8,426,836 B2* | 4/2013 | Mikawa et al. | 257/2 |
| 8,530,321 B2* | 9/2013 | Ninomiya et al. | 438/384 |
| 8,551,853 B2* | 10/2013 | Tsuji et al. | 438/382 |
| 8,559,205 B2* | 10/2013 | Mikawa et al. | 365/100 |
| 8,735,860 B2* | 5/2014 | Park et al. | 257/2 |
| 8,766,232 B2* | 7/2014 | Choi et al. | 257/4 |
| 8,866,123 B2* | 10/2014 | Sasago et al. | 257/4 |
| 8,884,444 B2* | 11/2014 | Nitta | 257/776 |
| 2004/0202041 A1* | 10/2004 | Hidenori | 365/233 |
| 2005/0111247 A1 | 5/2005 | Takaura et al. | |
| 2006/0157680 A1 | 7/2006 | Takaura et al. | |
| 2006/0268594 A1* | 11/2006 | Toda | 365/100 |
| 2008/0048166 A1 | 2/2008 | Takaura et al. | |
| 2008/0105878 A1* | 5/2008 | Ohara | 257/74 |
| 2009/0250680 A1 | 10/2009 | Takaura et al. | |
| 2010/0032641 A1* | 2/2010 | Mikawa et al. | 257/3 |
| 2010/0051892 A1* | 3/2010 | Mikawa et al. | 257/2 |
| 2010/0237313 A1* | 9/2010 | Mikawa et al. | 257/2 |
| 2010/0258779 A1* | 10/2010 | Mikawa et al. | 257/2 |
| 2010/0264393 A1* | 10/2010 | Mikawa et al. | 257/2 |
| 2010/0283026 A1* | 11/2010 | Mikawa et al. | 257/2 |
| 2010/0321095 A1* | 12/2010 | Mikawa et al. | 327/525 |
| 2011/0220861 A1* | 9/2011 | Himeno et al. | 257/4 |
| 2011/0233511 A1* | 9/2011 | Kawashima et al. | 257/4 |
| 2011/0284816 A1* | 11/2011 | Fujii et al. | 257/4 |
| 2012/0104350 A1* | 5/2012 | Himeno et al. | 257/4 |
| 2012/0298945 A1* | 11/2012 | Mikawa et al. | 257/1 |

FOREIGN PATENT DOCUMENTS

| | | |
|---|---|---|
| JP | 2004-355670 A | 12/2004 |
| JP | 2006-120701 A | 5/2006 |
| JP | 2007-053309 A | 3/2007 |
| WO | 2009-008080 A1 | 1/2009 |

* cited by examiner

NON-VOLATILE MEMORY DEVICE HAVING BIT LINES AND SOURCE LINES ARRANGED IN PARALLEL AND MANUFACTURING METHOD THEREOF

CROSS-REFERENCE TO RELATED PATENT APPLICATION

The application claims priority to Japanese Patent Application No. 2012-228256 filed on Oct. 15, 2012, the entire disclosure of which is incorporated herein by reference.

BACKGROUND OF THE INVENTION

1. Field of the Invention

The present invention relates to a non-volatile memory device and a manufacturing method thereof. More specifically, the present invention relates to a 1T1R non-volatile memory device including memory cells each of which includes one transistor and one memory element.

2. Description of the Related Art

In recent years, with progresses of digital technologies, electronic devices such as portable information devices and information home electric appliances have been developed to provide higher functionalities. For this reason, there have been demands for an increase in a capacity of a non-volatile memory device, reduction in write electric power in the non-volatile memory device, reduction in write/read time in the non-volatile memory device, and a longer life of the non-volatile memory device.

Under the circumstances in which there are such demands, the existing flash memory including a floating gate has been developed to provide further miniaturization. Also, it is expected that a non-volatile semiconductor memory element (variable resistance memory) including as a memory section a variable resistance element which stably changes a retained resistance value in response to a voltage pulse applied thereto can achieve further miniaturization, a higher speed, and lower electric power consumption, because its memory cell is implemented with a simple structure.

Therefore, conventionally, a memory cell (1T1R memory cell) which performs a stable memory operation using one transistor and one memory element is created, and high-dense integration is implemented using this cell.

International Publication No. 2009/00808 discloses a 1T1R memory device. In the memory device disclosed in this literature, a bit line BL connected to an upper electrode of a memory element crosses a source line SL connected to a lower electrode of the memory element such that the bit line BL and the source line SL are orthogonal to each other (FIG. 3 of International Publication No. 2009/00808). In this memory device, a variable resistance element RM is connected to a n-type semiconductor region (source, drain) via a plug, a first layer wire, and a plug (z2 region in FIG. 7 of International Publication No. 2009/00808).

Japanese Laid-Open Patent Application Publication No. 2004-355670 discloses a 1T1R memory device. In the memory device disclosed in this literature, a bit line connected to one of electrodes of a memory element and a common source line connected to the other electrode of the memory element extend in parallel with each other (FIG. 4 of Japanese Laid-Open Patent Application Publication No. 2004-355670).

SUMMARY OF THE INVENTION

An object of the present invention is to reduce a size of a memory cell, while reducing electric power consumption during writing to a selected memory element and attaining a higher-speed operation by arranging a bit line BL and a source line SL in parallel with each other, in a non-volatile memory device.

According to an aspect of the present invention, a non-volatile memory device comprises a substrate; first wires extending in a first direction on and above a first plane parallel to a main surface of the substrate; second wires extending in a second direction crossing the first direction, on and above a second plane which is parallel to the main surface of the substrate and more distant from the substrate than the first plane; third wires extending in the second direction on and above a fourth plane which is parallel to the main surface of the substrate and more distant from the substrate than the second plane; and memory cells provided to correspond to three-dimensional cross-points of the first wires and the third wires, respectively; each of the memory cells including one transistor and one variable resistance element; the transistor being provided on and above the substrate, and including a first main electrode, a second main electrode, and a control electrode; wherein the control electrode is connected to or integral with corresponding one of the first wires; the variable resistance element being placed on and above a third plane which is parallel to the main surface of the substrate, more distant from the substrate than the second plane and closer to the substrate than the fourth plane, and including a lower electrode, an upper electrode and a variable resistance layer disposed between the lower electrode and the upper electrode; wherein the upper electrode is connected to corresponding one of the third wires; the non-volatile memory device further comprising: a first contact plug extending from an upper end surface of the first main electrode to the second plane and connected to corresponding one of the second wires; a second contact plug extending from an upper end surface of the second main electrode to the second plane; and a third contact plug extending from an upper end surface of the second contact plug and connected to the lower electrode; wherein the second main electrode and the lower electrode are connected to each other via the second contact plug and the third contact plug.

According to an aspect of the present invention, a method of manufacturing a non-volatile memory device comprises the steps of: forming on and above a substrate, a transistor including a first main electrode, a second main electrode, and a control electrode, and forming first wires on and above a first plane parallel to a main surface of the substrate such that each of the first wires extends in a first direction and is connected to or integral with the control electrode; forming a first contact plug and a second contact plug such that the first contact plug extends from an upper end surface of the first main electrode to a second plane which is parallel to the main surface of the substrate and more distant from the substrate than the first plane, and the second contact plug extends from an upper end surface of the second main electrode to the second plane; forming second wires on and above the second plane such that each of the second wires is connected to an upper end surface of the first contact plug and extends in a second direction crossing the first direction; forming a third contact plug such that the third contact plug is connected to an upper end surface of the second contact plug and extends from the upper end surface of the second contact plug; forming a variable resistance element on and above a third plane which is parallel to the main surface of the substrate and more distant from the substrate than the second plane such that the variable resistance element includes a lower electrode, an upper electrode and a variable resistance layer disposed between the lower electrode and the upper electrode and the lower electrode is connected to the third contact plug; and forming third wires on and above a fourth plane which is parallel to the main surface of the substrate and more distant from the substrate than the third plane such that each of the third wires extends in the second direction and is connected to the upper electrode.

According to an aspect of the present invention, it becomes possible to achieve advantages that, in the non-volatile memory device, a size of the memory cell can be reduced, while reducing electric power consumption during writing to a selected memory element and attaining a higher-speed operation by arranging a bit line BL and a source line SL in parallel with each other.

DETAILED DESCRIPTION OF THE PREFERRED EMBODIMENTS

Figure 1A:
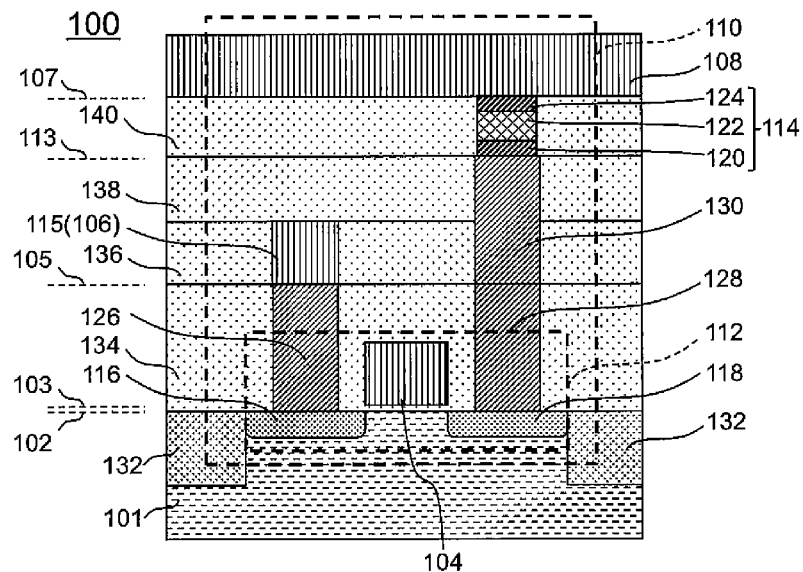
FIG. 1A is a cross-sectional view showing an exemplary schematic configuration of a non-volatile memory device according to Embodiment 1, and is a cross-sectional view taken along line A-A' of FIG. 1C.

Hereinafter, embodiments of the present invention will be described with reference to the attached drawings.

The embodiments described hereinafter are specific examples of the present invention. Numeric values, shapes, materials, constituents (elements), layout positions of the constituents, connection form of the constituents, steps, the order of the steps, etc., which are illustrated in the embodiments described below, are merely exemplary, and are not intended to limit the present invention. The present invention is limited only by claims. Also, among the constituents in the embodiments described below, the constituents which are not recited in independent claims defining a broadest concept of the present invention will be described as arbitrary constituents. Description of the constituents designated by the same reference numerals in the drawings will be sometimes omitted. For easier understanding, in the drawings, the constituents are schematically shown, and their shapes, dimension ratio, etc., are not sometimes accurate. Moreover, in a manufacturing method, the order of the steps, etc., can be changed and other known steps may be added.

Embodiment 1

A non-volatile memory device of Embodiment 1 comprises a substrate; first wires extending in a first direction on and above a first plane parallel to a main surface of the substrate; second wires extending in a second direction crossing the first direction, on and above a second plane which is parallel to the main surface of the substrate and more distant from the substrate than the first plane; third wires extending in the second direction on and above a fourth plane which is parallel to the main surface of the substrate and more distant from the substrate than the second plane; and memory cells provided to correspond to three-dimensional cross-points of the first wires and the third wires, respectively; each of the memory cells including one transistor and one variable resistance element; the transistor being provided on and above the substrate, and including a first main electrode, a second main electrode, and a control electrode; wherein the control electrode is connected to or integral with corresponding one of the first wires; the variable resistance element being placed on and above a third plane which is parallel to the main surface of the substrate, more distant from the substrate than the second plane and closer to the substrate than the fourth plane, and including a lower electrode, an upper electrode and a variable resistance layer disposed between the lower electrode and the upper electrode; wherein the upper electrode is connected to corresponding one of the third wires; the non-volatile memory device further comprising: a first contact plug extending from an upper end surface of the first main electrode to the second plane and connected to corresponding one of the second wires; a second contact plug extending from an upper end surface of the second main electrode to the second plane; and a third contact plug extending from an upper end surface of the second contact plug and connected to the lower electrode; wherein the second main electrode and the lower electrode are connected to each other via the second contact plug and the third contact plug.

In this configuration, in the non-volatile memory device, a size of the memory cell can be reduced, while reducing electric power consumption during writing to a selected memory element and attaining a higher-speed operation by arranging a bit line BL and a source line SL (second wire and third wire) in parallel with each other.

In the above non-volatile memory device, a plurality of variable resistance elements 114 may be arranged like islands along the second direction such that the plurality of variable resistance elements 114 correspond to one third wire 103.

In this configuration, since a current can be concentratively applied to the variable resistance element, a resistance changing operation can be stabilized. In addition, since the plurality of variable resistance elements are isolated from each other, an operation of each of the variable resistance elements can be stabilized.

In the above non-volatile memory device, the variable resistance layer may include a plurality of metal oxide layers which are different in composition from each other.

In this configuration, since a greater portion of a voltage applied between the electrodes to cause resistance change is fed to one of the metal oxide layers, a redox reaction taking place in this one of the metal oxides is facilitated.

In the above non-volatile memory device, a spacing between the second wire and the third wire may be set smaller than a line width of the second wire and a line width of the third wire, when viewed from the thickness direction of the substrate.

In this configuration, a cell area can be effectively reduced.

In the above non-volatile memory device, the second wire may have a protruding portion which overlaps with the third wire when viewed from the thickness direction of the substrate, and the first contact plug may extend from an upper end surface of the first main electrode to a lower surface of the protruding portion.

In this configuration, the second wire and the first contact plug can be easily connected to each other while reducing a portion of the second wire and a portion of the third wire, which portions overlap with each other, when viewed from the thickness direction of the substrate.

In the above non-volatile memory device, the transistor may be configured such that the first main electrode and the second main electrode included in each transistor are arranged in parallel with the second direction, when viewed from the thickness direction of the substrate.

In this configuration, by placing the transistor in parallel with a bit line BL and a source line SL, it becomes possible to reduce electric power consumption during writing to a selected memory element and attain a higher-speed operation.

A method of manufacturing a non-volatile memory device of Embodiment 1 comprises forming on and above a substrate, a transistor including a first main electrode, a second main electrode, and a control electrode, and forming first wires on and above a first plane parallel to a main surface of the substrate such that each of the first wires extends in a first direction and is connected to or integral with the control electrode; forming a first contact plug and a second contact plug such that the first contact plug extends from an upper end surface of the first main electrode to a second plane which is parallel to the main surface of the substrate and more distant from the substrate than the first plane, and the second contact plug extends from an upper end surface of the second main electrode to the second plane; forming second wires on and above the second plane such that each of the second wires is connected to an upper end surface of the first contact plug and extends in a second direction crossing the first direction; forming a third contact plug such that the third contact plug is connected to an upper end surface of the second contact plug and extends from the upper end surface of the second contact plug; forming a variable resistance element on and above a third plane which is parallel to the main surface of the substrate and more distant from the substrate than the second plane such that the variable resistance element includes a lower electrode, an upper electrode and a variable resistance layer disposed between the lower electrode and the upper electrode and the lower electrode is connected to the third contact plug; and forming third wires on and above a fourth plane which is parallel to the main surface of the substrate and more distant from the substrate than the third plane such that each of the third wires extends in the second direction and is connected to the upper electrode.

In this method, in the non-volatile memory device, a size of the memory cell can be reduced, while reducing electric power consumption during writing to a selected memory element and attaining a higher-speed operation by arranging a bit line BL and a source line SL in parallel with each other.

[Device Configuration]

Figure 1B:
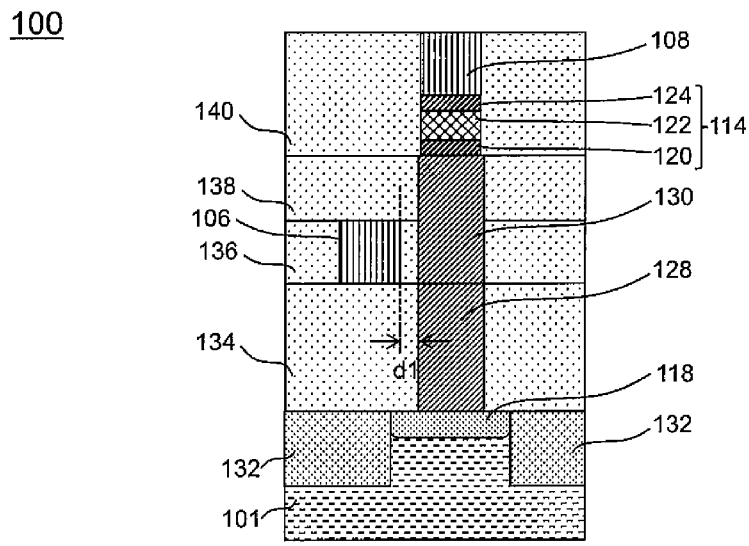
FIG. 1B is a cross-sectional view showing the exemplary schematic configuration of the non-volatile memory device according to Embodiment 1, and is a cross-sectional view taken along line B-B' of FIG. 1C.
Figure 1C:
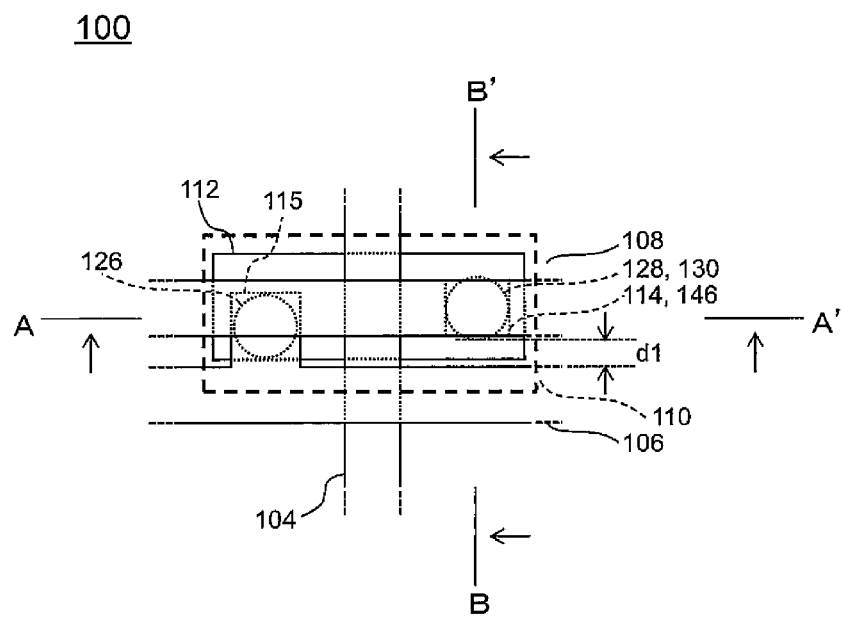
FIG. 1C is a plan view showing the exemplary schematic configuration of the non-volatile memory device according to Embodiment 1.

FIG. 1A is a cross-sectional view showing an exemplary schematic configuration of a non-volatile memory device according to Embodiment 1, and is a cross-sectional view taken along line A-A' of FIG. 1C. FIG. 1B is a cross-sectional view showing the exemplary schematic configuration of the non-volatile memory device according to Embodiment 1, and is the cross-sectional view taken along line B-B' of FIG. 1C. FIG. 1C is a plan view showing the exemplary schematic configuration of the non-volatile memory device according to Embodiment 1. Hereinafter, a non-volatile memory device 100 of Embodiment 1 will be described with reference to FIGS. 1A to 1C (hereinafter will be expressed as "FIG. 1").

In the example of FIG. 1, the non-volatile memory device 100 includes a substrate 101, a first wire 104, a second wire 106, a third wire 108, a memory cell 110, a first contact plug 126, a second contact plug 128 and a third contact plug 130. The memory cell 110 includes a transistor 112 and a variable resistance element 114. The transistor 112 includes a first main electrode 116, a second main electrode 118 and a control electrode (first wire 104). The variable resistance element 114 includes a lower electrode 120, an upper electrode 124 and a variable resistance layer 122.

The substrate 101 may include, for example, a silicon substrate.

The first wire 104 extends in a first direction on and above a first plane 103 which is parallel to a main surface of the substrate 101. The first wire 104 may comprise, for example, any one of polysilicon, titanium (Ti), tantalum (Ta), aluminum (Al), tungsten (W), a nitride of any one of these materials, an oxide of any one of these materials, and a stacked-layer structure of these materials. The first wire 104 may have a width of 16 to 100 [nm]. In the example of FIG. 1, the first wire 104 is integral with the control electrode of the transistor 112. The first wire 104 and the control electrode may be formed as separate constituents and may be connected to each other. In the example of FIG. 1, the first direction is perpendicular to a drawing sheet of FIG. 1.

The second wire 106 extends in a second direction crossing the first direction, on and above a second plane 105 which is parallel to the main surface of the substrate 101 and more distant from the substrate 101 than the first plane 103. In the example shown in FIG. 1, the second direction is parallel to the drawing sheet of FIG. 1.

The second wire 106 (transistor wire) may be formed within, for example, a second interlayer insulating layer 136, and may include an adhesive layer in contact with the second interlayer insulating layer 136 and a filling layer formed inward relative to the adhesive layer. The adhesive layer may comprise, for example, tantalum (Ta), a tantalum nitride (TaN), titanium (Ti), a titanium nitride (TiN), and ruthenium (Ru). The filling layer may comprise, for example, a material containing copper (Cu) as a major component. In the example of FIG. 1, the second wire 106 has a protruding portion 115 which overlaps with the third wire 108 when viewed from a thickness direction of the substrate 101. A minimum line width of the second wire 106 may be set to 20 to 120 [nm]. A minimum width of the isolation (minimum isolation width): minimum distance from an adjacent member formed using the same mask) of the second wire 106 is 20 to 120 [nm].

The third wire 108 extends in the second direction on and above a fourth plane 107 which is parallel to the main surface 102 of the substrate and more distant from the substrate than the second plane 105. The second wire 106 and the third wire 108 extend in parallel with each other.

The third wire 108 may be formed within, for example, a fourth interlayer insulating layer 140 and comprise an adhesive layer in contact with the fourth interlayer insulating layer 140 and a filling layer formed inward relative to the adhesive layer. The adhesive layer may comprise, for example, tantalum (Ta), a tantalum nitride (TaN), titanium (Ti), a titanium nitride (TiN), and ruthenium (Ru). The filling layer may comprise, for example, a material containing copper (Cu) as a major component. A minimum line width of the third wire 108 may be set to 20 to 120 [nm]. A minimum isolation width of the third wire 108 is 20 to 120 [nm].

A passivation layer may be formed to cover an upper end surface of the fourth interlayer insulating layer 140 and the third wire 108. The passivation layer may comprise, for example, a silicon nitride layer.

Memory cells 110 are provided at three-dimensional cross-points of the first wires 104 and the third wires 108, respectively. Each of the memory cells 110 includes one transistor 112 and one variable resistance element 114.

The transistor 112 is formed on and above the substrate 101. In the example of FIG. 1, the transistor 112 is a MOSFET (MOS field effect transistor).

Each of the first main electrode 116 and the second main electrode 118 is a source region or a drain region of the transistor 112. The source region or the drain region comprises a silicon substrate implanted with n-type impurities such as phosphorous (P) and arsenic (As), for example, in a case where the transistor 112 is a N-type transistor. The source region or the drain region comprises a silicon substrate implanted with p-type impurities such as boron (B) and indium (In), for example, in a case where the transistor 112 is a P-type transistor.

One of the first main electrode 116 and the second main electrode 118 is a source region and the other is a drain region. Which of the first main electrode 116 and the second main electrode 118 is the source region is suitably selected depending on a type of the transistor used and a circuit configuration.

A silicide may be provided in a portion of each of the source region and the drain region. The silicide may comprise a compound containing either one of a metal selected from a group consisting of nickel (Ni), platinum (Pt), and cobalt (Co) and an alloy of metals selected from the group, and silicon.

The control electrode is connected to or integral with the first wire 104. In the example of FIG. 1, the control electrode is integral with the first wire 104.

The control electrode may comprise, for example, any one of polysilicon, titanium (Ti), tantalum (Ta), aluminum (Al), tungsten (W), a nitride of any one of these materials, an oxide of any one of these materials, and a stacked-layer structure of these materials. In the present embodiment, a width of the control electrode may be set to 16 to 100 [nm].

A gate insulating layer may be formed between the control electrode and the substrate 101. As the gate insulating layer, for example, an oxide layer such as a silicon oxide layer, a silicon oxynitride layer, a metal oxide layer, such as an oxide layer of hafnium (Hf), titanium (Ti), tantalum (Ta), zirconium (Zr), lanthanum (La), aluminum (Al), etc., and a stacked-layer structure of these insulating layers, may be used.

A side wall (side wall protective layer) may be formed on a side wall portion of the control electrode. The side wall may comprise, for example, a silicon nitride layer (SiN), a silicon oxide layer (SiO) and a stacked-layer structure of these materials. A width (thickness) of the side wall may be set to 16 to 100 [nm].

In the example of FIG. 1, the transistor 112 is configured such that the first main electrode 116 and the second main electrode 118 included in each of the transistors 112 are arranged in parallel with the second direction, when viewed from the thickness direction of the substrate 101. Alternatively, the transistor 112 may be configured such that the first main electrode 116 and the second main electrode 118 included in each of the transistors 112 are arranged to be orthogonal to the second direction, when viewed from the thickness direction of the substrate 101. In a further alternative, the transistor 112 may be configured such that the first main electrode 116 and the second main electrode 118 included in each of the transistors 112 are arranged in a direction crossing at an angle which is greater than 0 degree and less than 90 degrees with respect to the second direction, when viewed from the thickness direction of the substrate 101.

For example, in the example of FIG. 1, by forming the first main electrode 116 immediately below the second wire 106, forming the second main electrode 118 immediately below the third wire 108, and placing the control electrode between the first main electrode 116 and the second main electrode 118, the transistor 112 is formed obliquely with respect to the second direction, when viewed from the thickness direction of the substrate 102. In this structure, the first contact plug 126 is allowed to contact both of the first main electrode 116 and the second wire 106 without forming the protruding portion 115. That is, the protruding portion 115 may be omitted.

The variable resistance element 114 is placed on and above a third plane 113 which is parallel to the main surface of the substrate 101, more distant from the substrate 101 than the second plane 105, and closer to the substrate 101 than the fourth plane 107. The variable resistance element 114 may have a shape which is similar to a circle, a square, a rectangle, or an oval, when viewed from a thickness direction. The variable resistance element 114 may have a size in a thickness direction thereof (e.g., length of one side in the case of the square, diameter in the case of the circle) of, for example, 45 to 300 [nm].

A plurality of variable resistance elements 114 may be arranged like islands along the second direction such that a plurality of variable resistance elements 114 correspond to one third wire 108.

The lower electrode 120 comprises a lower electrode material. A standard electrode potential of the lower electrode material may be lower than that of an upper electrode material constituting the upper electrode 124. A thickness of the lower electrode 120 may be set to, for example, 5 to 100 [nm].

As the lower electrode material, for example, a tantalum nitride (TaN), a titanium nitride (TiN), tungsten (W), nickel (Ni), tantalum (Ta), titanium (T), aluminum (Al), etc., may be used in a case where a tantalum oxide is used as a variable resistance layer 122 as will be described later.

The upper electrode 124 is connected to the third wire 108. The upper electrode 124 comprises an upper electrode material. A standard electrode potential of the upper electrode material may be higher than, for example, that of a metal contained in a metal oxide constituting the variable resistance layer 122 and that of the lower electrode material constituting the lower electrode 120. In the example of FIG. 1, the upper electrode 124 is in contact with the third wire 108.

As the upper electrode material, for example, iridium (Ir), platinum (Pt), palladium (Pd), gold (Au), copper (Cu), silver (Ag), etc., may be used, in a case where the tantalum oxide is used as the metal oxide constituting the variable resistance layer 122.

When a standard electrode potential of the lower electrode material is V1, a standard electrode potential of tantalum is VTa, and a standard electrode potential of the upper electrode material is V2, in a case where the tantalum oxide is used as the material constituting the variable resistance layer 122, a relationship of VTa<V2 and V1<V2 may be satisfied. In this configuration, a redox reaction is allowed to take place selectively and a stable resistance changing phenomenon can be achieved, in the vicinity of an interface between the upper electrode 124 and the variable resistance layer 122. By setting V1<VTa, a more stable resistance changing phenomenon can be achieved. In a case where a metal oxide other than the tantalum oxide is used as the material constituting the variable resistance layer 122, a standard electrode potential of the corresponding metal may be used as VTa. A thickness of the upper electrode 124 may be set to, for example, 5 to 100 [nm].

The variable resistance layer 122 is a layer which is disposed between the lower electrode 120 and the upper electrode 124 and reversibly changes its resistance value in response to an electric signal applied between the lower electrode 120 and the upper electrode 124. For example, the variable resistance layer 122 is a layer which reversibly switches its resistance state between a high-resistance state and a low-resistance state according to a polarity of a voltage applied between the lower electrode 120 and the upper electrode 124. The variable resistance layer 122 may be composed of a single metal oxide layer having a specified oxygen content atomic percentage.

Alternatively, the variable resistance layer 122 may include a plurality of metal oxide layers which are different in composition from each other. Specifically, the variable resistance layer 122 may include at least two layers which are a first variable resistance layer connected to the lower electrode 120 and a second variable resistance layer connected to the upper electrode 124. In this case, the first variable resistance layer comprises an oxygen-deficient first metal oxide, while the second variable resistance layer comprises a second metal oxide which is lower in degree of oxygen deficiency than the first metal oxide. A minute localized region which reversibly changes degree of oxygen deficiency in response to an electric pulse applied thereto is formed within the second variable resistance layer of the variable resistance element. It is considered that the localized region includes a filament formed by an oxygen-defective site.

The first metal constituting the first metal oxide and the second metal constituting the second metal oxide may be different metals. In this case, the second metal oxide may be lower in degree of oxygen deficiency than the first metal oxide, i.e., higher in resistance than the first metal oxide. In such a configuration, a greater portion of a voltage applied between the first electrode and the second electrode to cause resistance change is fed to the second metal oxide, and the redox reaction taking place within the second metal oxide is facilitated.

In a case where the first metal constituting the first metal oxide which will become the first variable resistance layer and the second metal constituting the second metal oxide which will become the second variable resistance layer are materials which are different from each other, the standard electrode potential of the second metal may be lower than the standard electrode potential of the first metal. The standard electrode potential is a characteristic in which as its value is greater, the corresponding material is less easily oxidated. This allows the redox reaction to take place more easily in the second metal oxide which is relatively lower in standard electrode potential. It is estimated that in a resistance changing phenomenon, the redox reaction takes place in the minute localized region formed within the second metal oxide which is higher in resistance, the filament (conductive path) changes, and thereby its resistance value (degree of oxygen deficiency) changes.

For example, a stable resistance changing operation is attained by using an oxygen-deficient tantalum oxide ($TaO_x$) as the first metal oxide and by using a titanium oxide ($TiO_2$) as the second metal oxide. Titanium (standard electrode potential=−1.63 eV) has a lower standard electrode potential than tantalum (standard electrode potential=−0.6 eV). By using as the second metal oxide an oxide of a metal having a lower standard electrode potential than a metal of the first metal oxide, the redox reaction easily takes place within the second metal oxide. As another combination, an aluminum oxide ($Al_2O_3$) may be used as the second metal oxide which will become the high-resistance layer. For example, an oxygen-deficient tantalum oxide ($TaO_x$) may be used as the first metal oxide, and the aluminum oxide ($Al_2O_3$) may be used as the second metal oxide.

The term "degree of oxygen deficiency" refers to a ratio of oxygen deficiency with respect to an amount of oxygen constituting an oxide having a stoichiometric composition (stoichiometric composition corresponding to a greatest resistance value in a case where there exist plural stoichiometric compositions) of each metal oxide. A metal oxide having a stoichiometric composition is more stable and has a greater resistance value than a metal oxide having another composition.

For example, in a case where metal is tantalum (Ta), an oxide of tantalum having a stoichiometric composition according to the above definition is $Ta_2O_5$, and therefore is expressed as $TaO_{2.5}$. The degree of oxygen deficiency of $TaO_{2.5}$ is 0%. The degree of oxygen deficiency of $TaO_{1.5}$, is (2.5−1.5)/2.5=40%. An oxygen excess metal oxide has a negative value in degree of oxygen deficiency. In the present specification, the degree of oxygen deficiency is meant to include a positive value, 0 and a negative value unless otherwise explicitly noted.

An oxide which is lower in degree of oxygen deficiency is closer to the oxide having a stoichiometric composition and therefore has a greater resistance value, while an oxide which is higher in degree of oxygen deficiency is closer to a metal constituting the oxide and therefore has a smaller resistance value.

The term "oxygen content atomic percentage" refers to a ratio of the number of oxygen atoms to the total number of atoms. For example, the oxygen content atomic percentage of $Ta_2O_5$ is the ratio of the number of oxygen atoms to the total number of atoms (O/(Ta+O)) and is 71.4 atom %. Therefore, the oxygen content atomic percentage of the oxygen-deficient tantalum oxide is higher than 0 and lower than 71.4 atom %. For example, in a case where the metal constituting the first metal oxide layer and the metal constituting the second metal oxide layer are of the same kind, there is a correspondence between the oxygen content atomic percentage and the degree of oxygen deficiency. Specifically, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

As a metal constituting the variable resistance layer, a metal other than tantalum may be used. As the metal constituting the variable resistance layer, a transition metal, or aluminum (Al) may be used. As the transition metal, tantalum (Ta), titanium (Ti), hafnium (Hf), zirconium (Zr), niobium (Nb), tungsten (W), nickel (Ni), etc., may be used. Since the transition metal can assume plural oxidated states, different resistance states can be implemented by the redox reaction. A thickness of the variable resistance layer 122 may be set to, for example, 5 to 100 [nm].

The variable resistance element may be practiced as a non-volatile memory element such as ReRAM, PRAM, FeRAM, MRAM, or CBRAM.

In a case where the variable resistance element is practiced as the non-volatile memory element of ReRAM, it is estimated that in a resistance changing phenomenon in the variable resistance layer having the stacked-layer structure, the redox reaction takes place in the minute localized region formed within the second metal oxide which is higher in resistance, the filament (conductive path) in the localized region changes, and thereby its resistance value changes.

Specifically, when a positive voltage is applied to the second electrode connected to the second metal oxide on the basis of the first electrode, oxygen ions within the variable resistance layer are drawn toward the second metal oxide. Thereby, an oxidation reaction proceeds in the minute localized region formed within the second metal oxide, and the degree of oxygen deficiency reduces. This may result in a situation in which connection of the filament in the localized region does not easily occur, and the resistance value decreases.

Conversely, when a negative voltage is applied to the second electrode connected to the second metal oxide on the basis of the first electrode, the oxygen ions within the second metal oxide are forced to migrate toward the first metal oxide. Thereby, a reduction reaction proceeds in the minute localized region formed within the second metal oxide, and the degree of oxygen deficiency increases. This may result in a situation in which connection of the filament in the localized region easily occurs, and the resistance value decreases.

A side wall (side wall protective layer) may be formed on a portion or an entire of a side wall (side wall of the lower electrode 120, side wall of the variable resistance layer 122 and side wall of the upper electrode 124) of the variable resistance element 114. The side wall may comprise, for example, a silicon nitride layer, a silicon oxide layer (SiOC) containing carbon, etc. A width (thickness) of the side wall may be set to 5 to 50 [nm].

The first contact plug 126 extends from an upper end surface of the first main electrode 116 to the second plane 105 and is connected to the second wire 106. In the example of FIG. 1, the first contact plug 126 is formed to extend from the upper end surface of the first main electrode 116 to a lower surface of the protruding portion 115. In other words, the first contact plug 126 is in contact with the second wire 106 on the lower surface of the protruding portion 115. The first contact plug 126 may be in contact with a silicide formed on the upper end surface of the first main electrode 116. A diameter of the first contact plug 126 may be set to, for example, 20 to 100 [nm]. In the example of FIG. 1, the first contact plug 126 is formed to penetrate the first interlayer insulating layer 134. The first contact plug 126 connects the first main electrode 116 and the second wire 106 to each other.

The second contact plug 128 extends from an upper end surface of the second main electrode 118 to the second plane 105. The second contact plug 128 may be in contact with a silicide formed on the upper end surface of the second main electrode 118. A diameter of the second contact plug 128 may be set to, for example, 20 to 100 [nm]. In the example of FIG.

1, the second contact plug 128 is formed to penetrate the first interlayer insulating layer 134.

A third contact plug 130 extends from an upper end surface of the second contact plug 128 and is connected to the lower electrode 120. The second main electrode 118 is connected to the lower electrode 120 via the second contact plug 128 and the third contact plug 130. A diameter of the second contact plug 128 may be set to, for example, 20 to 100 [nm].

In the example of FIG. 1, the third contact plug 130 is formed to penetrate the second interlayer insulating layer 136 and the third interlayer insulating layer 138. The third contact plug 130 may be formed to cover at least a portion of the upper end surface of the second contact plug 128.

In a case where a first etching stopper layer is formed on and above the first interlayer insulating layer 134, the third contact plug 130 may penetrate the first etching stopper layer. In a case where a second etching stopper layer is formed on and above the second interlayer insulating layer 136, the third contact plug 130 may be formed to penetrate the second etching stopper layer.

Each of the first contact plug 126, the second contact plug 128, and the third contact plug 130 may include an adhesive layer which is in contact with the corresponding interlayer insulating layer and a filling layer formed inward relative to the adhesive layer. The adhesive layer may comprise, for example, titanium (Ti), a titanium nitride (TiN), etc. The filling layer may comprise a material containing, for example, tungsten (W) as a major component.

In the example of FIG. 1, the first interlayer insulating layer 134 is formed to cover the main surface of the substrate 101 and the transistor 112. The first interlayer insulating layer 134 may comprise, for example, a silicon oxide layer having a thickness of 300 to 500 [nm]. The first etching stopper layer (not shown) may be formed on and above the first interlayer insulating layer 134, as a silicon carbide oxide (SiCO) layer having a thickness of 20 [nm].

In the example of FIG. 1, the second interlayer insulating layer 136 is formed to cover the upper end surface of the first interlayer insulating layer 134, the upper end surface of the first contact plug 126, and the upper end surface of the second contact plug 128. The second interlayer insulating layer 136 may comprise, for example, a silicon oxide layer having a thickness of 50 to 300 [nm]. The second etching stopper layer (not shown) may be formed on and above the second interlayer insulating layer 136 as a silicon carbide oxide (SiCO) layer having a thickness of 20 [nm].

In the example of FIG. 1, a third interlayer insulating layer 138 is formed to cover an upper end surface of the second interlayer insulating layer 136 and the second wire 106. The third interlayer insulating layer 138 may comprise, for example, a silicon oxide layer having a thickness of 50 to 150 [nm].

In the example of FIG. 1, a fourth interlayer insulating layer 140 is formed to cover an upper end surface of the third interlayer insulating layer 138 and the variable resistance element 114. The fourth interlayer insulating layer 140 may comprise, for example, a silicon oxide layer having a thickness of 200 to 500 [nm].

In the example of FIG. 1, an isolation region 132 (trench isolation) is formed on and above the substrate 101 in a position which is outward relative to the transistor 112, when viewed from the thickness direction of the substrate 101. The isolation region 132 may be formed by filling a silicon oxide layer in a trench formed on the substrate 101.

[Memory Cell Size]

In the 1T1R memory device, electric power consumption during writing to a selected memory element can be reduced, and a higher-speed operation can be attained, by using the configuration in which the bit line connected to one of the electrodes of the memory element and the source line connected to the other electrode of the memory element extend in parallel with each other.

Accordingly, the use of the configuration in which the bit line and the source line extend in parallel with each other, in the above mentioned 1T1R memory device was studied. Hereinafter, Studied example will be described.

Figure 7A:
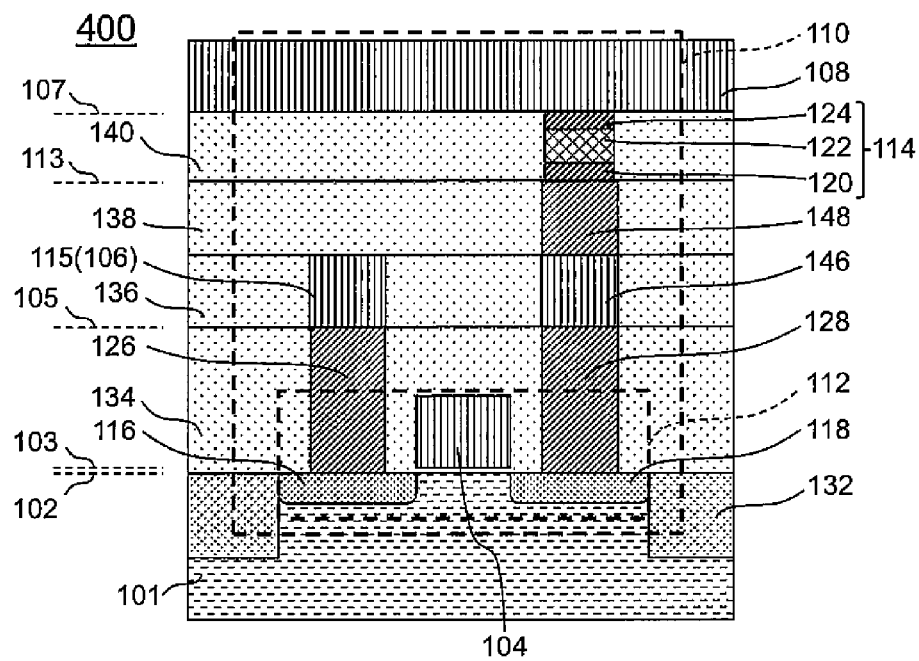
FIG. 7A is a cross-sectional view showing an exemplary schematic configuration of a non-volatile memory device according to Studied example, and is a cross-sectional view taken along line A-A' of FIG. 7C.
Figure 7B:
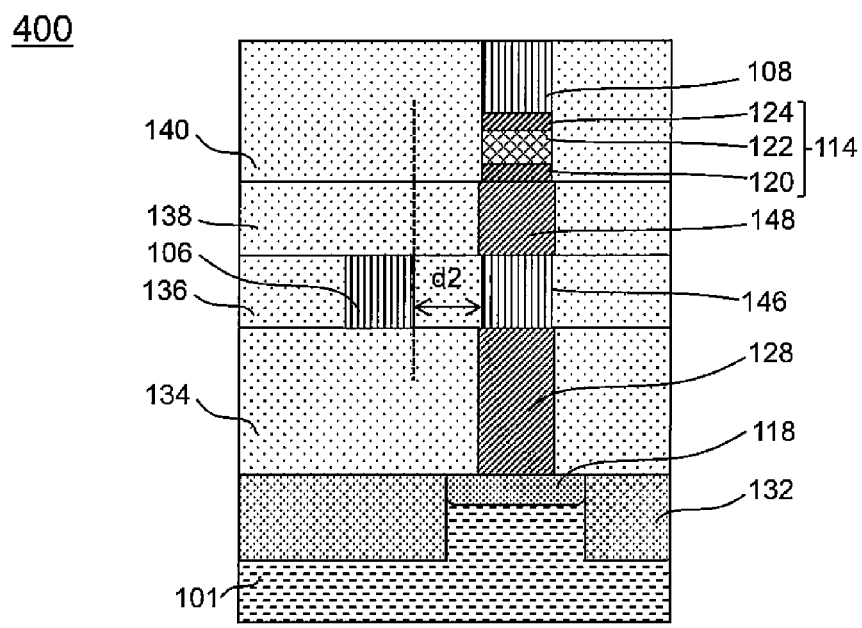
FIG. 7B is a cross-sectional view showing the exemplary schematic configuration of the non-volatile memory device according to Studied example, and is a cross-sectional view taken along line B-B' of FIG. 7C.
Figure 7C:
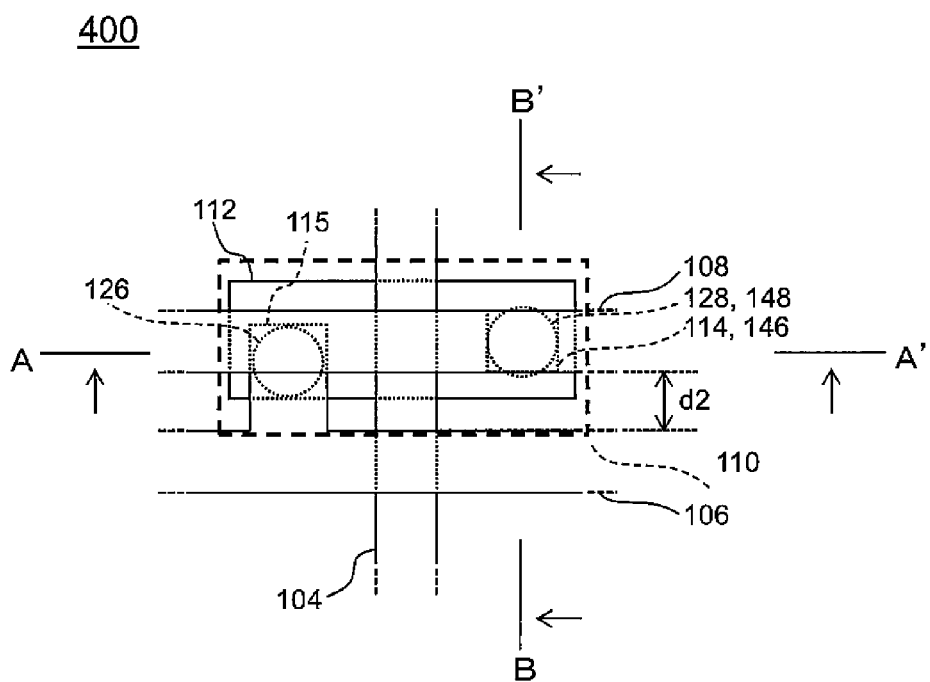
FIG. 7C is a plan view showing the exemplary schematic configuration of the non-volatile memory device according to Studied example.

FIG. 7A is a cross-sectional view showing an exemplary schematic configuration of a non-volatile memory device according to Studied example, and is a cross-sectional view taken along line A-A' of FIG. 7C. FIG. 7B is a cross-sectional view showing the exemplary schematic configuration of the non-volatile memory device according to Studied example, and is a cross-sectional view taken along line B-B' of FIG. 7C. FIG. 7C is a plan view showing the exemplary schematic configuration of the non-volatile memory device according to Studied example.

In a non-volatile memory device 400 according to Studied example, the third contact plug 130 in the non-volatile memory device 100 (FIG. 1) of Embodiment 1 is replaced by a connection wire layer 146 and a fourth contact plug 148.

The connection wire layer 146 is an electric conductor layer formed within the second interlayer insulating layer 136 using the same mask as that for the second wire 106 including the protruding portion 115. A lower end surface of the connection wire layer 146 is in contact with the upper end surface of the second contact plug 128. The connection wire layer 146 may comprise the same material as the material of the second wire 106. The connection wire layer 146 may have a shape of, for example, a square having sides of 20 to 120 [nm]. A minimum isolation width of the connection wire layer 146 is 20 to 120 [nm].

The connection wire layer 146 corresponds to the first layer wire (designated by reference symbol 25 in FIG. 7 of Patent Literature 1) formed within the interlayer insulating layer (designated by reference symbol 18 in FIG. 7 of Patent Literature 1) in the memory device disclosed in Patent Literature 1.

The fourth contact plug 148 extends from an upper end surface of the connection wire layer 146 and is connected to the lower electrode 120. The second main electrode 118 is connected to the lower electrode 120 via the second contact plug 128, the connection wire layer 146, and the fourth contact plug 148. A diameter of the fourth contact plug 148 may be set to, for example, 20 to 100 [nm].

The fourth contact plug 148 corresponds to the plug (designated by reference symbol 46 in FIG. 7 of Patent Literature 1) in the memory device disclosed in Patent Literature 1.

Except for the above, the configuration of the non-volatile memory device 400 according to Studied example may be the same as the configuration of the non-volatile memory device 100 of Embodiment 1. Therefore, in FIGS. 7A to 7C (hereinafter will be expressed as "FIG. 7"), the same constituents as those of FIG. 1 are designated by the same reference numerals and names, and will not be described in detail in repetition.

In order to operate the non-volatile memory device 400, it is necessary to form the connection wire layer 146 and the second wire 106 such that they are isolated (insulated) from each other. However, since the connection wire layer 146 and the second wire 106 are patterned using the same mask by lithography, it is necessary to set an isolation width (d2 in FIG. 7B) between the connection wire layer 146 and the second wire 106 greater than a minimum width determined by a wavelength of a light source used in lithography. This is because, if the isolation width is set smaller than the minimum width, the connection wire layer 146 and the second wire 106 may contact each other, which increases a possibility of an incorrect operation.

For example, according to International Technology Roadmap for Semiconductor: ITRS which is an edition on 2010, the following estimation is made regarding a semiconductor technology trend. In a case where a minimum dimension of a gate width is 27 [nm], in a high-performance logic device at a time point of 2010, an estimated value of a minimum value of a wire pitch which is a sum of a line width and an isolation width is 90 [nm]. Therefore, a minimum isolation width d2 between the second wire 106 and the connection wire layer 146 is 45 [nm], when viewed from the thickness direction of the substrate 101. In this case, a memory cell size in the direction along the line B-B' of FIG. 7C is 135 [nm] which is a sum of two minimum line widths (minimum line width of second wire 106 and minimum line width of connection wire layer 146) and one minimum isolation width (minimum isolation width between second wire 106 and connection wire layer 146).

In contrast, in the configuration of Embodiment 1, as shown in FIG. 1B, the second contact plug 128 and the third contact plug 130 are directly connected to each other, and the connection wire layer 146 does not exist between the second contact plug 128 and the third contact plug 130. That is, the second wire 106 has only to be isolated from the second contact plug 128 and the third contact plug 130. The mask used to form the second wire 106 is different from the mask used to form the second contact plug 128 and the third contact plug 130. In light of this, the minimum isolation width d1 may be set to a value which is greater than a value which is a sum of tolerances of mask alignments, a difference in dimension among the second wires 106, and a difference in dimension among the second contact plugs 128 and the third contact plugs 130.

According to the above road map, in a high performance logic device in which a minimum dimension of the gate electrode is 27 [nm] and a minimum value of the wire pitch is 90 [nm], a minimum diameter of the contact plug is 51 [nm] and a maximum value of overlay among different masks is 11 [nm]. It can be considered that the difference in dimension among different masks, corresponding to the wire, is 4.5 [nm] which is 10% of the minimum line width 45 [nm], while the difference in dimension among different masks, corresponding to the contact plug, is 5.1 [nm] which is 10% of the minimum diameter 51 [nm]. Therefore, the minimum isolation width d1 between the second wire 106, and the second contact plug 128 and the third contact plug 130 is 11 [nm] (maximum value of overlay among different masks) plus 2.25 [nm] (half value of the difference in dimension among line widths) plus 2.55 [nm] (half value of the difference in diameter among contact plugs) is 15.8 [nm]. A memory cell size in the direction along line B-B' of FIG. 1C is 45 [nm] (minimum line width of the second wire 106) plus 51 [nm] (minimum diameter of the second contact plug 128 and the third contact plug 130) plus 15.8 [nm] (minimum isolation width between the second wire 106, and the second contact plug 128 and the third contact plug 130) is 111.8 [nm]. These values are smaller than the isolation width 45 [nm] between the second wire 106 and the connection wire layer 146, and the memory cell size 135 [nm] in Studied example, respectively. Thus, in the example of FIG. 1, the memory cell size in the direction along line B-B' of FIG. 1C can be reduced.

As shown in FIG. 1B, when viewed from the thickness direction of the substrate 101, a spacing between the second wire 106 and the third wire 108 is smaller than the line width of the second wire 106 and the line width of the third wire 108.

[Parasitic Resistance]

Figure 2:
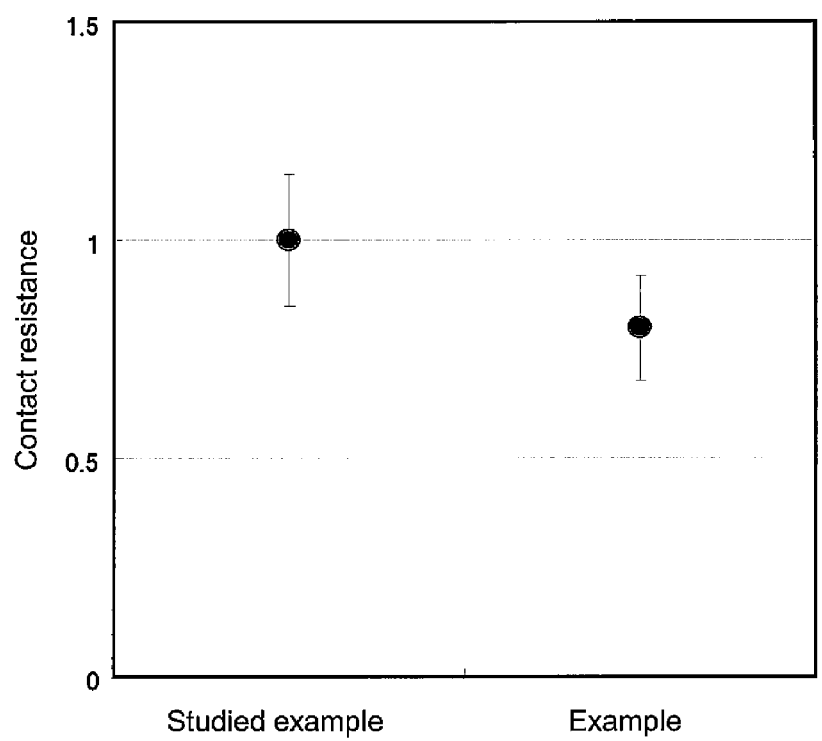
FIG. 2 is a view showing an average value and a standard deviation of a contact resistance of each of a non-volatile memory device according to Example of Embodiment 1 and a non-volatile memory device according to Studied example.

FIG. 2 is a view showing an average value and a standard deviation of a contact resistance of each of the non-volatile memory device according to Example of Embodiment 1 and the non-volatile memory device according to Studied example.

In order to measure the contact resistance in the non-volatile memory device according to Example, a test pattern was created, in which plural sets each including the second main electrode 118, the second contact plug 128, the third contact plug 130, and the lower electrode 120 were connected in series. The second main electrode 118 had a depth of 200 nm, a width of 100 nm, and a thickness of 10 nm and comprised a compound of nickel and silicon. Stacked-layer structures each including the second contact plug 128 and the third contact plug 130 were connected to both ends of the second main electrode 118 in a depth direction. The second contact plug 128 had a diameter of 40 nm and a length of 120 nm and comprised a stacked-layer structure of tungsten, a titanium nitride, and titanium. The third contact plug 130 had a diameter of 40 nm and a length of 120 nm, and comprised a stacked-layer structure of tungsten, a titanium nitride, and titanium. The lower electrode 120 had a depth of 200 nm, a width 100 nm, and a thickness of 50 nm, and comprised a titanium nitride. The above stacked-layer structures were connected to both ends of the lower electrode 120 in a depth direction. A test pattern was created, in which 100 of the above stacked-layer structures were connected in series. Resistances between both ends were measured as contact resistances. The number of samples in Example was 48.

In order to measure the contact resistance in the non-volatile memory device according to Studied example, a test pattern was created, in which plural sets each including the second main electrode 118, the second contact plug 128, the connection wire layer 146, and the fourth contact plug 148 were connected in series. The second main electrode 118 had a depth of 200 nm, a width of 100 nm, and a thickness of 10 nm and comprised a compound of nickel and silicon. Stacked-layer structures each including the second contact plug 128, the connection wire layer 146, and the fourth contact plug 148 were connected to both ends of the second main electrode 118 in a depth direction. The second contact plug 128 had a diameter of 40 nm and a length of 120 nm, and comprised a stacked-layer structure of tungsten, a titanium nitride, and titanium. The third contact plug 130 had a diameter of 40 nm and a length of 120 nm, and comprised a stacked-layer structure of tungsten, a titanium nitride, and titanium. The connection wire layer 146 had a square shape of 80 nm×80 nm and a thickness of 100 nm, and comprised a stacked-layer structure of copper, tantalum and a tantalum nitride. The fourth contact plug 148 had a diameter of 40 nm and a length of 120 nm, and comprised a stacked-layer structure of tungsten, a titanium nitride, and titanium. The lower electrode 120 had a depth of 200 nm, a width 100 nm, and a thickness of 50 nm, and comprised a titanium nitride. The above stacked-layer structures were connected to both ends of the lower electrode 120 in a depth direction. A test pattern was created, in which 100 of the above stacked-layer structures were connected in series. Resistances between both ends were measured as contact resistances. The number of samples in Example was 48.

As shown in FIG. 2, the contact resistance in Example was significantly smaller than the contact resistance in Studied example.

As should be appreciated from the above, in the configuration of Embodiment 1, since the connection wire layer 146 is not provided and the second contact plug 128 and the third contact plug 130 are directly connected to each other, no contact resistance occurs between the connection wire layer 146, and the second contact plug 128 and the third contact plug 130. Therefore, a parasitic resistance can be reduced.

In other words, in the configuration of Embodiment 1, a resistance increase on a surface of the contact plug and a surface of the connection wire layer, which surfaces contact each other, does not occur, the contact plug and the connection wire layer comprising different metals, and hence the contact resistance can be reduced. Therefore, it becomes possible to lessen non-uniformity of voltages and currents applied to variable resistance elements during a read operation and a write operation of the variable resistance elements 114. As a result, a more stable resistance changing operation can be implemented.

[Manufacturing Method]

FIGS. 3A to 3H are cross-sectional views showing the steps of an exemplary manufacturing method of the nonvolatile memory device according to Embodiment 1.

FIG. 3 A is a cross-sectional view showing the step of forming the transistor and the first wire on and above the substrate.

Figure 3A:
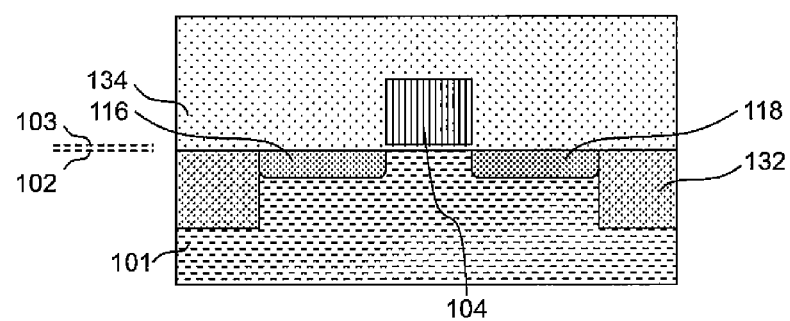
FIG. 3A is a cross-sectional view showing the step of an exemplary manufacturing method of the non-volatile memory device according to Embodiment 1, and is a cross-sectional view showing the step of forming a transistor and a first wire on and above a substrate.

The step of FIG. 3A is the step of forming on and above the substrate, the transistor including the first main electrode, the second main electrode and the control electrode and forming the first wire on and above the first plane parallel to the main surface of the substrate such that the first wire extends in the first direction and is connected to or integral with the control electrode.

Specifically, for example, the isolation region 132, the first main electrode 116 and the second main electrode 118 are formed on and above the substrate 101, and the first wire 104 is formed on and above the gate insulating layer (not shown), to complete the transistor 112. Thereafter, the first interlayer insulating layer 134 and the first etching stopper layer (not shown) are formed to cover the transistor 112. These constituents can be formed using a known method, which will not be described in detail.

Figure 3B:
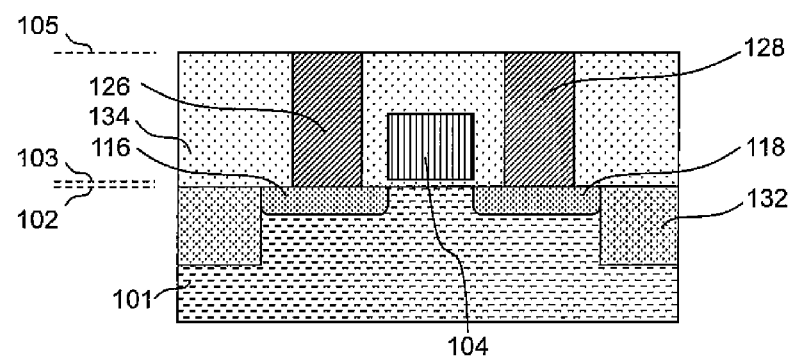
FIG. 3B is a cross-sectional view showing the step of the exemplary manufacturing method of the non-volatile memory device according to Embodiment 1, and is a cross-sectional view showing the step of forming a first contact plug and a second contact plug.

FIG. 3B is a cross-sectional view showing the step of forming the first contact plug and the second contact plug. The step of FIG. 3B is performed subsequently to and just after the step of FIG. 3A.

The step of FIG. 3B is the step of forming the first contact plug and the second contact plug such that the first contact plug extends from the upper end surface of the first main electrode to the second plane which is parallel to the main surface of the substrate and more distant from the substrate than the first plane, and the second contact plug extends from the upper end surface of the second main electrode to the second plane. These constituents can be formed using a known method, which will not be described in detail.

Figure 3C:
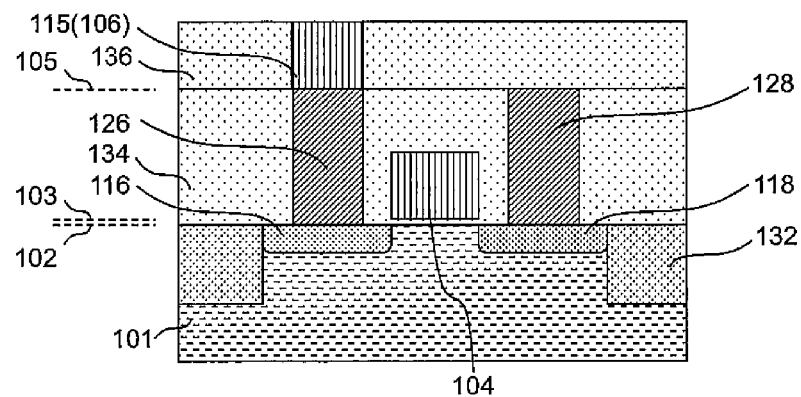
FIG. 3C is a cross-sectional view showing the step of the exemplary manufacturing method of the non-volatile memory device according to Embodiment 1, and is a cross-sectional view showing the step of forming a second wire.

FIG. 3C is a cross-sectional view showing the step of forming the second wire. The step of FIG. 3C is performed subsequently to and just after the step of FIG. 3B.

The step of FIG. 3C is the step of forming the second wire on and above the second plane such that the second wire is connected to the upper end surface of the first contact plug and extends in the second direction crossing the first direction.

Specifically, for example, the second interlayer insulating layer 136 is formed to cover the first interlayer insulating layer 134 (first etching stopper layer in the case where the first etching stopper layer is formed), the first contact plug 126 exposed on the upper end surface of the first interlayer insulating layer 134 and the second contact plug 128 exposed on the upper end surface of the first interlayer insulating layer 134. Then, using a desired mask and dry-etching, a trench of a desired shape is formed in the second interlayer insulating layer 136 and the first etching stopper layer. Then, by ALD (Atomic Layer Deposition), a tantalum nitride layer (thickness: 5 [nm]), and a tantalum layer (thickness: 5 [nm]) which will become the adhesive layer are deposited over the entire surface. Thereafter, by electroplating, copper (Cu) which will become the filling layer is deposited over the entire surface to have a thickness of 300 nm. Then, by chemical mechanical polishing (CMP), a portion of the material of the adhesive layer which is deposited over the second interlayer insulating layer 136, and a portion of the material of the filling layer which is deposited over the second interlayer insulating layer 136, are removed, to form the second wire 106. A width of the second wire 106 may be set to, for example, 45 [nm]. A thickness of the second wire 106 may be set to, for example, 80 [nm].

Figure 3D:
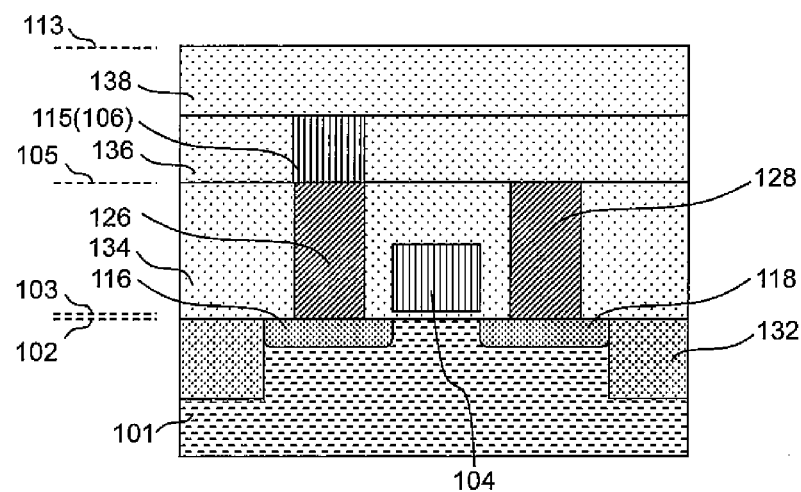
FIG. 3D is a cross-sectional view showing the step of the exemplary manufacturing method of the non-volatile memory device according to Embodiment 1, and is a cross-sectional view showing the step of forming an interlayer insulating layer.

FIG. 3D is a cross-sectional view showing the step of forming the interlayer insulating layer. The step of FIG. 3D is performed subsequently to and just after the step of FIG. 3C.

Specifically, for example, the second etching stopper layer (not shown) comprising the silicon carbide oxide (SiCO) is deposited to have a thickness of 20 [nm], and further, the third interlayer insulating layer 138 comprising the silicon oxide as a major component is deposited to have a thickness of 50 [nm].

Figure 3E:
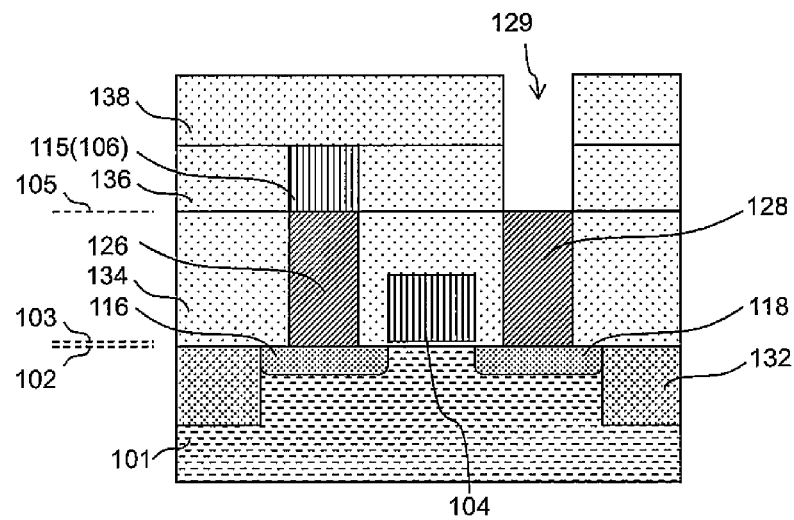
FIG. 3E is a cross-sectional view showing the step of the exemplary manufacturing method of the non-volatile memory device according to Embodiment 1, and is a cross-sectional view showing the step of forming a contact hole.

FIG. 3E is a cross-sectional view showing the step of forming the contact hole. The step of FIG. 3E is performed subsequently to and just after the step of FIG. 3D.

Specifically, for example, by lithography and dry-etching, a contact hole 129 is formed to penetrate the third interlayer insulating layer 138, the second etching stopper layer, the second interlayer insulating layer 136, and the first etching stopper layer such that at least a portion of the upper end surface of the second contact plug 128 is exposed. A diameter of the contact hole 129 may be set to, for example, 40 [nm].

Figure 3F:
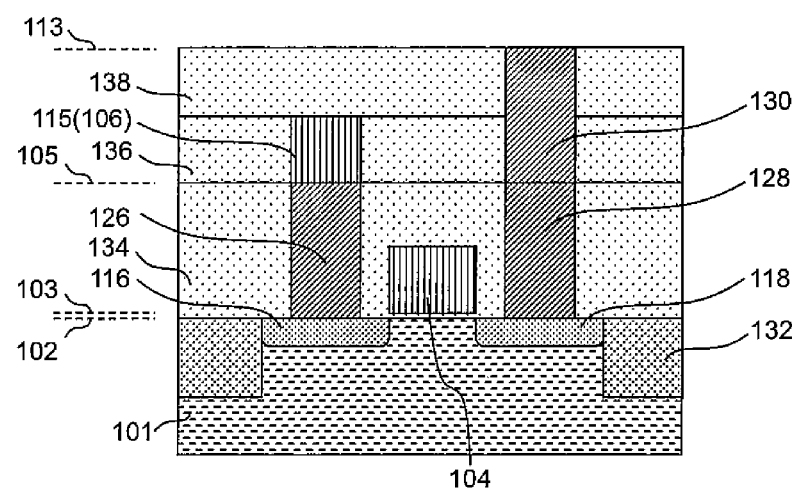
FIG. 3F is a cross-sectional view showing the step of the exemplary manufacturing method of the non-volatile memory device according to Embodiment 1, and is a cross-sectional view showing the step of forming a third contact plug.

FIG. 3F is a cross-sectional view showing the step of forming the third contact plug. The step of FIG. 3F is performed subsequently to and just after the step of FIG. 3E.

Specifically, for example, by ALD, a titanium nitride layer (TiN: thickness 5 [nm]), and a titanium layer (Ti: thickness: 5 [nm]) which will become the adhesive layer are deposited over the entire surface including an interior of the contact hole 129. Then, by ALD, tungsten (W: thickness: 300 [nm]) which will become the filling layer, is deposited over the entire surface. Then, by chemical mechanical polishing (CMP), a portion of the material of the adhesive layer which is deposited over the third interlayer insulating layer 138, and a portion of the material of the filling layer which is deposited over the third interlayer insulating layer 138, are removed, thereby completing the third contact plug 130.

The step of FIG. 3D, the step of FIG. 3E and the step of FIG. 3F are the step of forming the third contact plug such that the third contact plug is connected to the upper end surface of the second contact plug and extends from the upper end surface of the second contact plug.

Figure 3G:
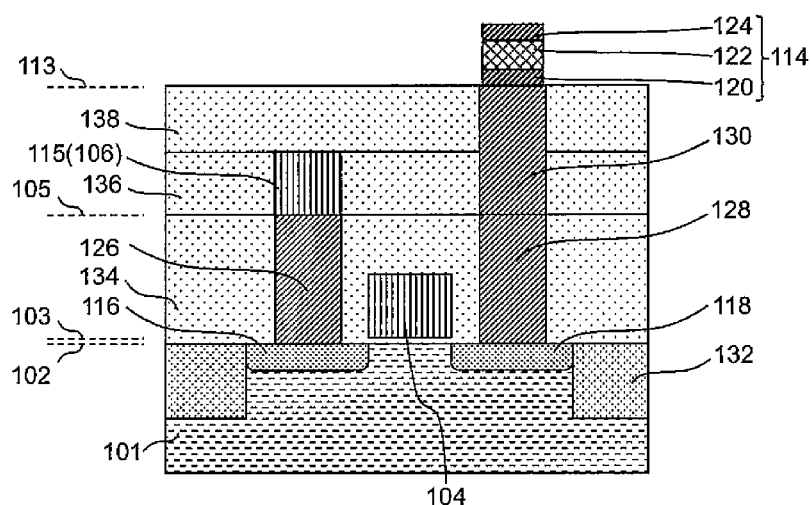
FIG. 3G is a cross-sectional view showing the step of the exemplary manufacturing method of the non-volatile memory device according to Embodiment 1, and is a cross-sectional view showing the step of forming a variable resistance element.

FIG. 3G is a cross-sectional view showing the step of forming the variable resistance element. The step of FIG. 3G is performed subsequently to and just after the step of FIG. 3F.

The step of FIG. 3G is the step of forming the variable resistance element on and above the third plane which is parallel to the main surface of the substrate and more distant from the substrate than the second plane such that the variable resistance element includes the lower electrode, the upper electrode, and the variable resistance layer disposed between the lower electrode and the upper electrode, and the lower electrode is connected to the third plug.

Specifically, for example, a lower electrode material layer, a variable resistance material layer and an upper electrode material layer are stacked in this order such that these layers cover at least a portion of the upper end surface of the third contact plug 130.

More specifically, for example, by sputtering, a tantalum nitride (TaN) is deposited to have a thickness of 5 to 20 [nm] as the lower electrode material layer. Although sputtering is used as a deposition method of the tantalum nitride in this example, CVD (chemical vapor deposition), or ALD may be used.

Following this, a tantalum oxide is deposited to have a thickness of 10 to 50 [nm] as the variable resistance material layer on and above the tantalum nitride layer, by reactive sputtering in which sputtering is conducted using tantalum as a target, in an atmosphere containing oxygen.

Following this, by sputtering, iridium (Ir) is deposited to have a thickness of 10 to 60 [nm] as the upper electrode material layer on and above the tantalum oxide layer.

Following this, using a desired mask and dry-etching, the lower electrode material layer, the variable resistance material layer and the upper electrode material layer are etched, thereby completing the variable resistance element 114.

Then, a silicon nitride layer may be deposited to have a thickness of 5 to 20 [nm] by ALD, and then anisotropic etching may be performed by dry-etching to form a side wall having a width of 5 to 15 [nm].

Figure 3H:
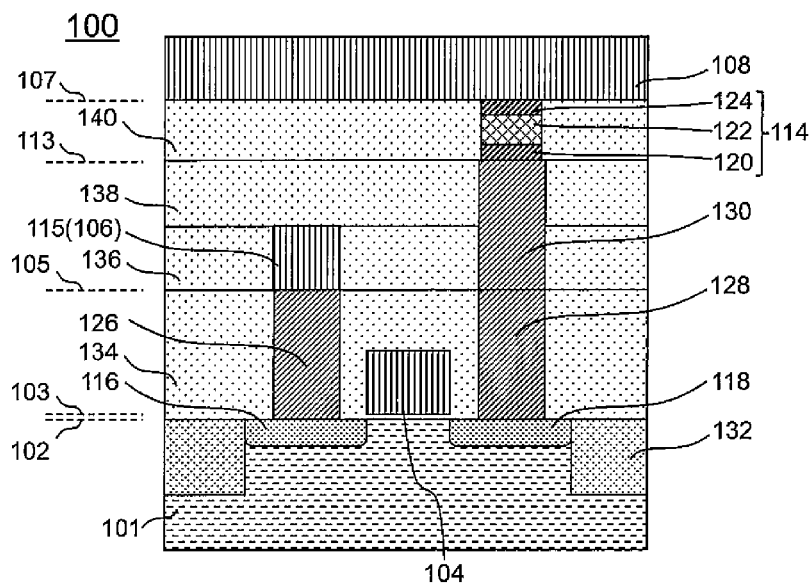
FIG. 3H is a cross-sectional view showing the step of the exemplary manufacturing method of the non-volatile memory device according to Embodiment 1, and is a cross-sectional view showing the step of forming a third wire.

FIG. 3H is a cross-sectional view showing the step of forming the third wire. The step of FIG. 3H is performed subsequently to and just after the step of FIG. 3G.

The step of FIG. 3H is the step of forming the third wire on and above the fourth plane which is parallel to the main surface of the substrate and more distant from the substrate than the third plane such that the third wire extends in the second direction and is connected to the upper electrode.

Specifically, for example, the fourth interlayer insulating layer 140 comprising the silicon oxide as a major component is deposited to have a thickness of 500 [nm], and then planarized by CMP.

Following this, using a desired mask and dry-etching, the trench of a desired shape is formed on the fourth interlayer insulating layer 140 such that at least a portion of the upper electrode 124 of the variable resistance element 114 is exposed. Then, by ALD, the tantalum nitride layer (thickness: 5 [nm]), and the tantalum layer (thickness: 5 [nm]) which will become the adhesive layer are deposited over the entire surface. Thereafter, by electroplating, copper (Cu) which will become the filling layer is deposited over the entire surface to have a thickness of 300 nm. Then, by CMP, a portion of the material of the adhesive layer which is deposited over the fourth interlayer insulating layer 140, and a portion of the material of the filling layer which is deposited over the fourth interlayer insulating layer 140, are removed, to form the third wire 108. A width of the third wire 108 may be set to, for example, 45 [nm]. A thickness of the third wire 108 may be set to, for example, 80 [nm].

Although as the manufacturing method of the non-volatile memory device, a case has been described, where the variable resistance element is formed by stacking the respective layers and then patterning them, the present invention is not limited to this. The variable resistance element of the present invention may be formed by sequentially forming the respective layers into the through-hole formed in the interlayer insulating layer. Alternatively, a portion of the plurality of layers may be formed outside of the through-hole and the remaining portion of the layers may be formed inside of the through-hole.

Modified Example

A non-volatile memory device according to Modified example of Embodiment 1 comprises a substrate; a plurality of first wires extending in a first direction on and above a first plane parallel to a main surface of the substrate; a plurality of second wires extending in a second direction crossing the first direction, on and above a second plane which is parallel to the main surface of the substrate and more distant from the substrate than the first plane; a plurality of third wires extending in the second direction on and above a fourth plane which is parallel to the main surface of the substrate and more distant from the substrate than the second plane; and a plurality of memory cells provided such that one memory cell at maximum corresponds to one of three-dimensional cross-points of the first wires and the third wires; each of the memory cells including one transistor and one variable resistance element, the transistor being provided on and above the substrate and including a first main electrode, a second main electrode, and a control electrode; wherein the control electrode is connected to or integral with corresponding one of the first wires; the variable resistance element being placed on and above a third plane which is parallel to the main surface of the substrate, more distant from the substrate than the second plane and closer to the substrate than the fourth plane, and including a lower electrode, an upper electrode and a variable resistance layer disposed between the lower electrode and the upper electrode; wherein the upper electrode is connected to corresponding one of the third wires, the non-volatile memory device further comprising a first contact plug extending from an upper end surface of the first main electrode to the second plane and connected to corresponding one of the second wires; a second contact plug extending from an upper end surface of the second main electrode to the second plane; and a third contact plug extending from an upper end surface of the second contact plug and connected to the lower electrode; wherein the second main electrode and the lower electrode are connected to each other via the second contact plug and the third contact plug, the plurality of memory cells correspond to one of the first wires, the plurality of memory cells correspond to one of the second wires, and the plurality of memory cells correspond to one of the third wires.

Two transistors adjacent to each other in the second direction may include a common first main electrode.

The second wire and the third wire may be arranged alternately and the control electrode may be provided at every other cross-point of the first wire and the third wire, (one control electrode is provided to correspond to the two cross-points) along the first wire, when viewed from the thickness direction of the substrate.

Figure 4A:
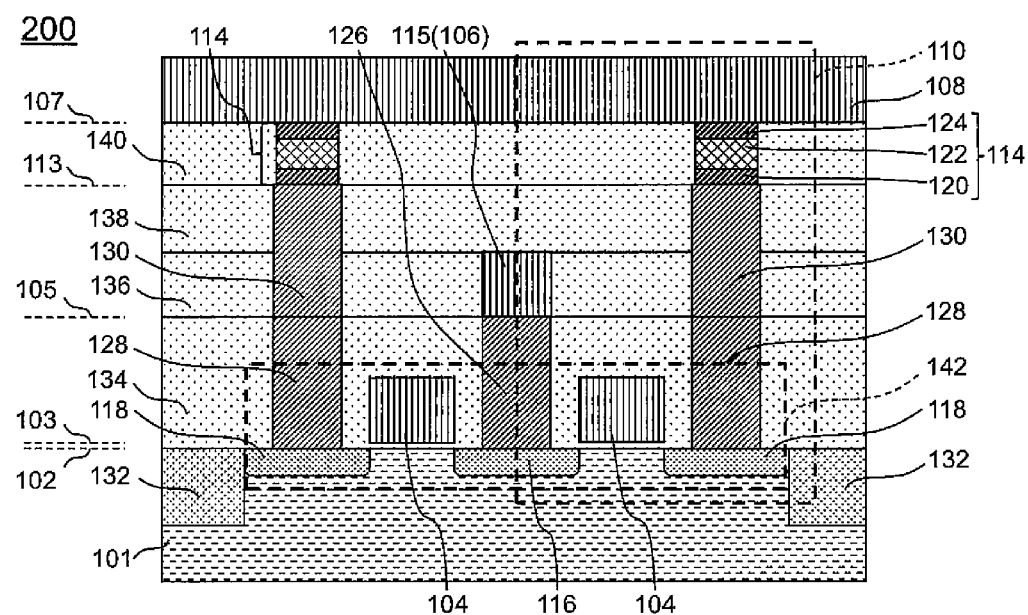
FIG. 4A is a cross-sectional view showing an exemplary schematic configuration of a non-volatile memory device according to Modified example of Embodiment 1, and is a cross-sectional view taken along line A-A' of FIG. 4B.
Figure 4B:
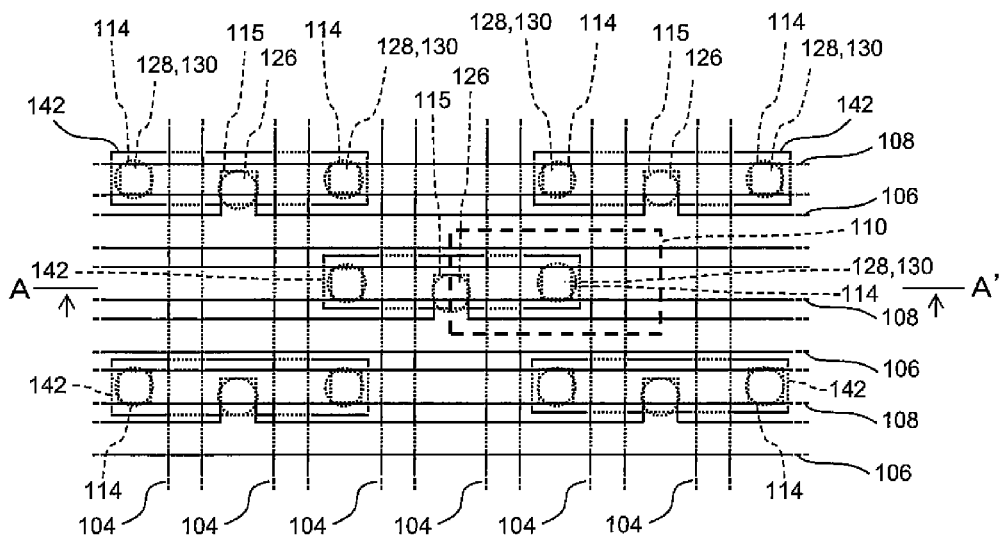
FIG. 4B is a plan view showing the exemplary schematic configuration of the non-volatile memory device according to Modified example of Embodiment 1.

FIG. 4A is a cross-sectional view showing an exemplary schematic configuration of the non-volatile memory device according to Modified example of Embodiment 1, and is a cross-sectional view taken along line A-A' of FIG. 4B. FIG. 4B is a plan view showing the exemplary schematic configuration of the non-volatile memory device according to Modified example of Embodiment 1. In FIG. 4B, a region surrounded by a dotted line corresponds to one unit of the memory cell of the non-volatile memory device. Hereinafter, a non-volatile memory device 200 according to Modified example of Embodiment 1 will be described with reference to FIGS. 4A and 4B (hereinafter will be expressed as FIG. 4).

In the example of FIG. 4, the second main electrode 118, the second contact plug 128, the third contact plug 130, and the variable resistance element 114 are independently provided for each of the two transistors which are adjacent to each other in the direction (second direction) in which the second wire 106 and the third wire 108 extend, and for each of the two memory cells 110 which are adjacent to each other in the second direction. On the other hand, the first main electrode 116, the first contact plug 126, and the protruding portion 115 are shared as common constituents by the two transistors which are adjacent to each other in the second direction, and by the two memory cells 110 which are adjacent to each other in the second direction. A region in which the two transistors that share the first main electrode 116 as the common constituent are formed is an active region 142. Between adjacent active regions 142, the isolation region 132 is formed. When viewed from the thickness direction of the substrate 101, the second wire 106 and the third wire 108 are arranged alternately, and each control electrode is provided at every other cross-point of the first wire 104 and the third wire 108 (one control electrode is provided to correspond to the two cross-points), along the first wire 104.

The first wire 104 is connected to or integral with the control electrodes of the plurality of memory cells 110.

The second wire 106 is connected to the first contact plugs 126 of the plurality of memory cells 110. Two first contact plugs 126 included in two memory cells 110 (a pair of memory cells which share as common constituents the first main electrode 116, the first contact plug 126 and the protruding portion 115) corresponding to four first wires 104, when viewed from the thickness direction of the substrate 101, are connected to one second wire 106.

The third wire 108 is connected to the upper electrodes 124 of the plurality of memory cells 110. Two upper electrodes 124 included in two memory cells 110 (a pair of memory cells which share as common constituents the first main electrode 116, the first contact plug 126 and the protruding portion 115) corresponding to four first wires 104, when viewed from the thickness direction of the substrate 101, are connected to one third wire 108.

In other words, in the example of FIG. 4, the plurality of variable resistance elements 114 are arranged like islands along the second direction such that the plurality of variable resistance elements 114 correspond to one third wire 108.

Except for the above, the configuration of the non-volatile memory device 200 according to Modified example may be the same as the configuration of the non-volatile memory device 100 of Embodiment 1. Therefore, in FIG. 4, the same constituents as those of FIG. 1 are designated by the same reference numerals and names, and will not be described in detail in repetition.

In the configuration of the present modified example, a memory cell size in the second direction can be reduced, and the isolation region 132 can be increased in size.

The present modified example may be modified as in Embodiment 1.

Embodiment 2

A non-volatile memory device according to Embodiment 2, which is the non-volatile memory device according to one of Embodiment 1 and Modified example, further comprises an insulating layer formed on a side surface of the third contact plug.

A manufacturing method of the non-volatile memory device of Embodiment 2, which is the manufacturing method of the non-volatile memory device according to one of Embodiment 1 and Modified example, further comprises the step of forming an insulating layer disposed on a side surface of the third contact plug.

In this configuration, in the non-volatile memory device, a size of the memory cell can be reduced more effectively, while reducing electric power consumption during writing to a selected memory element and attaining a higher-speed operation.

[Device Configuration]

Figure 5A:
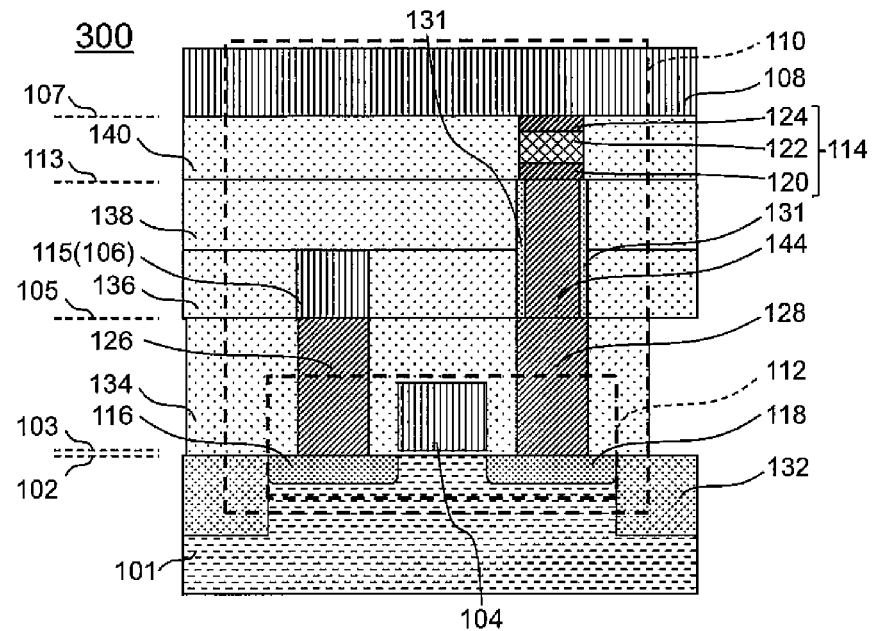
FIG. 5A is a cross-sectional view showing an exemplary schematic configuration of a non-volatile memory device according to Embodiment 2, corresponding to FIG. 1A.
Figure 5B:
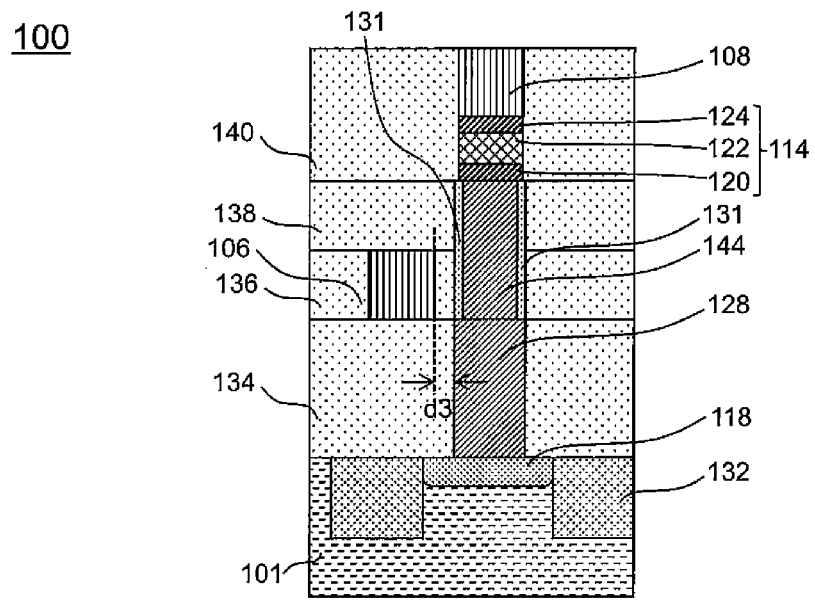
FIG. 5B is a cross-sectional view showing the exemplary schematic configuration of the non-volatile memory device according to Embodiment 2, corresponding to FIG. 1B.

FIG. 5A is a cross-sectional view showing an exemplary schematic configuration of a non-volatile memory device according to Embodiment 2, corresponding to FIG. 1A. FIG. 5B is a cross-sectional view showing the exemplary schematic configuration of the non-volatile memory device according to Embodiment 2, corresponding to FIG. 1B. Hereinafter, a non-volatile memory device 300 of Embodiment 2 will be described with reference to FIGS. 5A to 5B (hereinafter will be expressed as "FIG. 5"). A plan view of the non-volatile memory device 300 may be the same as FIG. 1C except that the third contact plug 130 is replaced by a third contact plug 144 and a side wall insulating layer 131, and therefore will be omitted.

The non-volatile memory device 300 of Embodiment 2 is configured such that the third contact plug 130 in the non-volatile memory device 100 (FIG. 1) of Embodiment 1 is replaced by the third contact plug 144 and the side wall insulating layer 131 (contact side wall protective layer) formed on a side surface of the third contact plug 144.

The side wall insulating layer 131 comprises an insulating material and is formed on an inner wall (side wall) of the contact hole. The third contact plug 144 is formed inward relative to the side wall insulating layer 131. On a bottom of the contact hole, the second contact plug 128 and the third contact plug 144 are in contact with each other.

The side wall insulating layer 131 may comprise a silicon oxide, a silicon nitride, a silicon carbide oxide, etc. A thickness of the side wall insulating layer 131 may be set to about 5 [nm].

The third contact plug 144 may comprise the same material as that of the third contact plug 130 of Embodiment 1. A diameter of the third contact plug 144 may be set to, for example, about 30 [nm].

In Embodiment 2, because of the side wall insulating layer 131, the second wire 106 and the third contact plug 144 are less likely to contact each other, even when a degree of overlay of mask alignment step increases. This makes it possible to further reduce a minimum isolation width d3 (minimum isolation width between the contact hole 129 filled with the side wall insulating layer 131 and the third contact plug 144, and the second wire 106), which can more effectively reduce a size of the memory cell, as compared to a case where the side wall insulating layer 131 is not provided.

Except for the above, the configuration of the non-volatile memory device 300 according to Embodiment 2 may be the same as the configuration of the non-volatile memory device 100 of Embodiment 1. Therefore, in FIG. 5, the same constituents as those of FIG. 1 are designated by the same reference numerals and names, and will not be described in detail in repetition.

[Manufacturing Method]

FIGS. 6A to 6F are cross-sectional views showing the steps of an exemplary manufacturing method of the non-volatile memory device according to Embodiment 2.

Figure 6A:
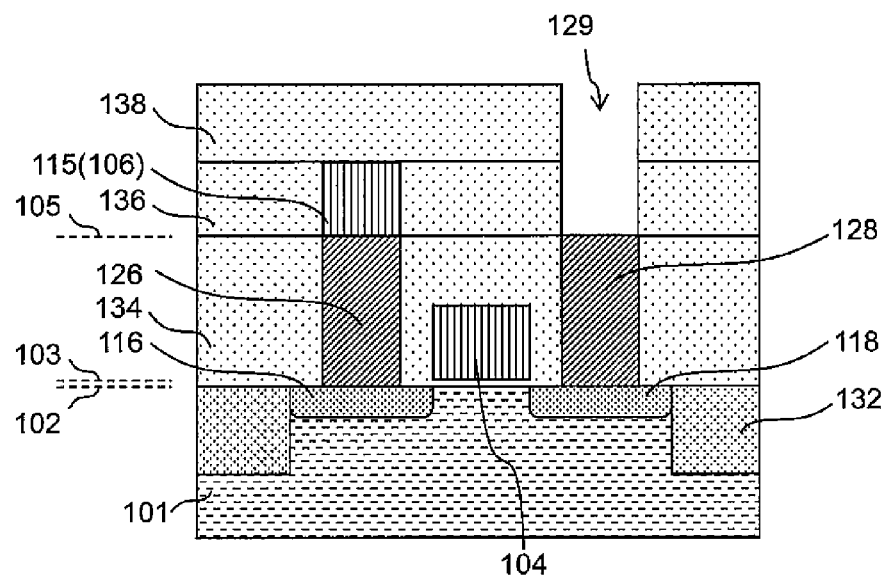
FIG. 6A is a cross-sectional view showing the step of an exemplary manufacturing method of the non-volatile memory device according to Embodiment 2, and is a cross-sectional view showing the step of forming on and above the substrate, the transistor, the first wire, the first contact plug, the second contact plug, the second wire, the interlayer insulating layer and the contact hole.

FIG. 6A is a cross-sectional view showing the step of forming on and above the substrate, the transistor, the first wire, the first contact plug, the second contact plug, the second wire, the interlayer insulating layer and the contact hole.

The step of FIG. 6A may be the same as the steps of FIGS. 3A to 3E, and will not be described in detail in repetition.

Figure 6B:
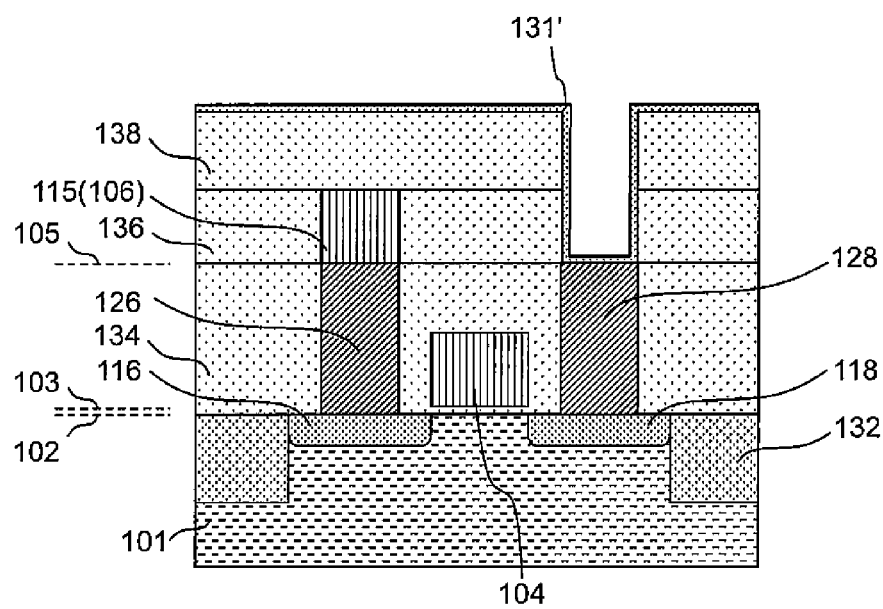
FIG. 6B is a cross-sectional view showing the step of the exemplary manufacturing method of the non-volatile memory device according to Embodiment 2, and is a cross-sectional view showing the step of forming an insulating material layer.

FIG. 6B is a cross-sectional view showing the step of forming an insulating material layer. The step of FIG. 6B is performed subsequently to and just after the step of FIG. 6A.

Specifically, for example, an insulating material layer 131' which will become the side wall insulating layer 131, is deposited to have a thickness of 6 [nm] by ALD. The insulating material layer 131' may comprise, for example, any one of a silicon nitride, a silicon oxide, and a silicon carbide oxide.

Figure 6C:
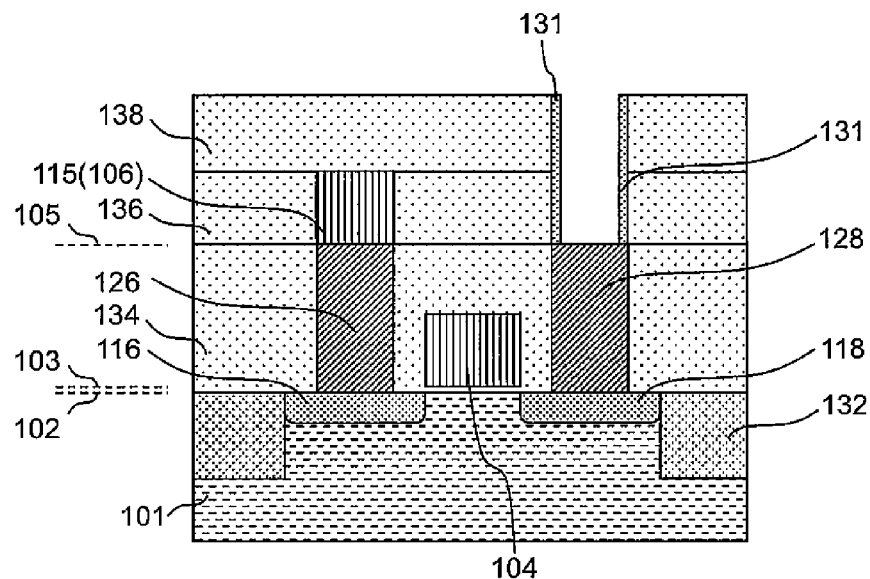
FIG. 6C is a cross-sectional view showing the step of the exemplary manufacturing method of the non-volatile memory device according to Embodiment 2, and is a cross-sectional view showing the step of forming a side wall insulating layer.

FIG. 6C is a cross-sectional view showing the step of forming the side wall insulating layer. The step of FIG. 6C is performed subsequently to and just after the step of FIG. 6B.

Specifically, for example, by dry-etching, a portion of the insulating material layer 131' which covers the second contact plug 128 and a portion of the insulating material layer 131' which overlies the third interlayer insulating layer 138, are removed while leaving the side wall insulating layer 131 on a portion of the side wall of the contact hole 129, thereby completing the side wall insulating layer 131. A thickness of the side wall insulating layer 131 may be set to, for example, 5 [nm].

The step of 6B and the step of 6C are the step of forming the side wall insulating layer disposed on the side surface of the third contact plug.

Figure 6D:
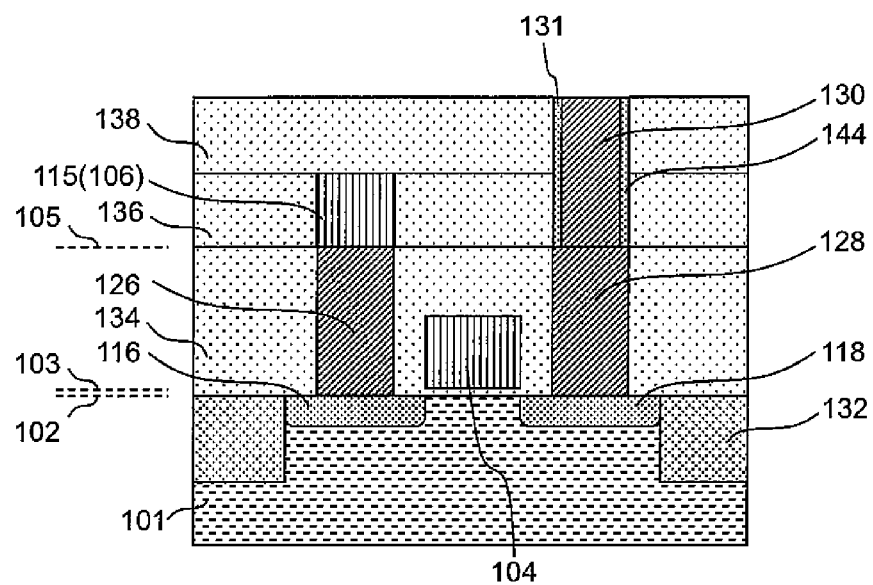
FIG. 6D is a cross-sectional view showing the step of the exemplary manufacturing method of the non-volatile memory device according to Embodiment 2, and is a cross-sectional view showing the step of forming a third contact plug.

FIG. 6D is a cross-sectional view showing the step of forming the third contact plug. The step of FIG. 6D is performed subsequently to and just after the step of FIG. 6C.

Specifically, for example, by ALD, a titanium nitride layer (TiN: thickness: 5 [nm]), and a titanium layer (Ti: thickness: 5 [nm]) which will become the adhesive layer are deposited over the entire surface including an interior of the contact hole 129 on which the side wall insulating layer 131 is formed. Then, by ALD, tungsten (W: thickness 300 [nm]) which will become the filling layer is deposited over the entire surface. Then, by CMP, a portion of the material of the adhesive layer which is deposited over the third interlayer insulating layer 138, and a portion of the material of the filling layer which is deposited over the third interlayer insulating layer 138, are removed, thereby completing the third contact plug 144.

Figure 6E:
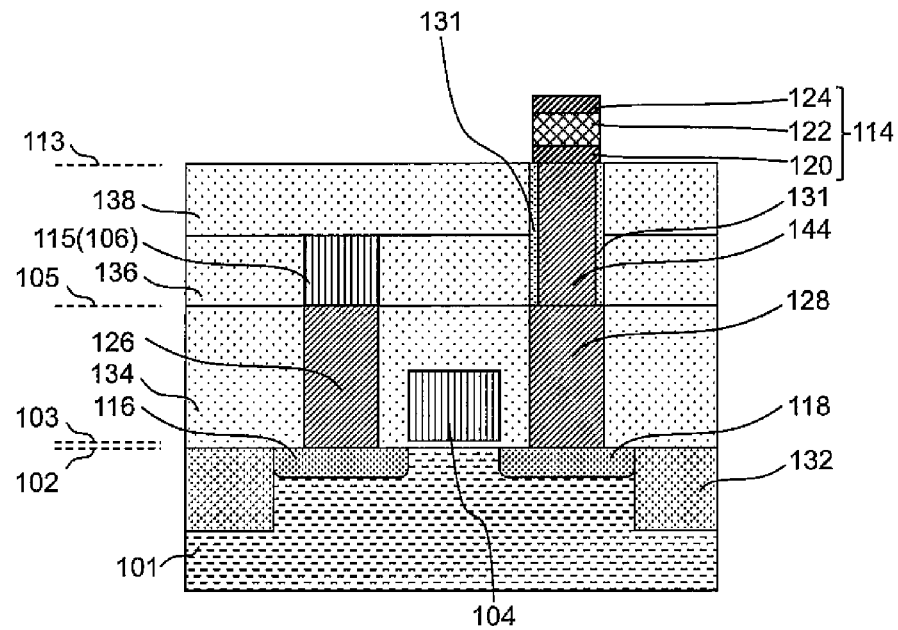
FIG. 6E is a cross-sectional view showing the step of the exemplary manufacturing method of the non-volatile memory device according to Embodiment 2, and is a cross-sectional view showing the step of forming the variable resistance element.

FIG. 6E is a cross-sectional view showing the step of forming the variable resistance element. The step of FIG. 6E is performed subsequently to and just after the step of FIG. 6D. The step of FIG. 6E is the same as the step of FIG. 3G, and therefore will not be described in detail in repetition.

Figure 6F:
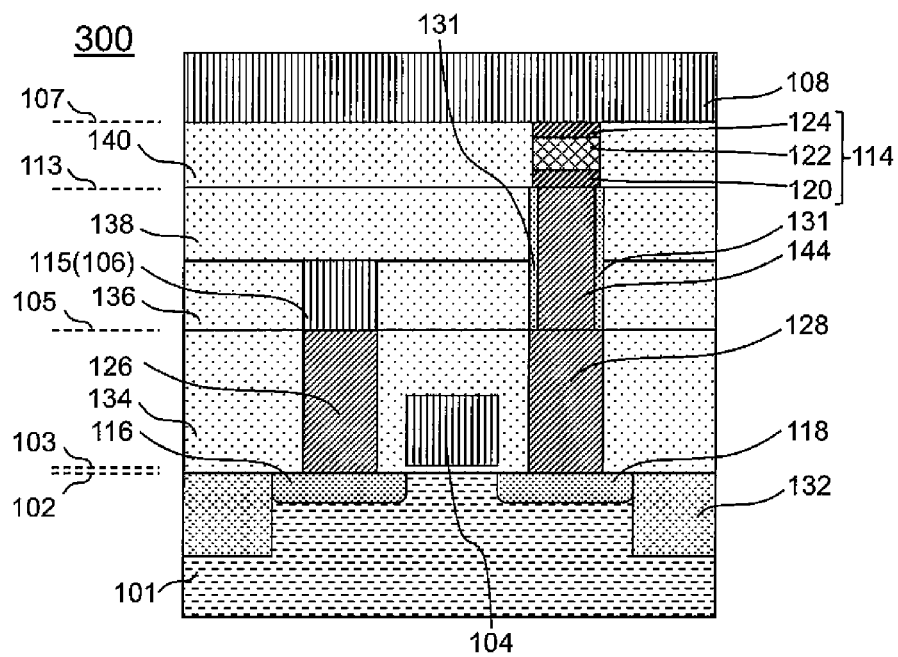
FIG. 6F is a cross-sectional view showing the step of the exemplary manufacturing method of the non-volatile memory device according to Embodiment 2, and is a cross-sectional view showing the step of forming the third wire.

FIG. 6F is a cross-sectional view showing the step of forming the third wire. The step of FIG. 6F is performed subsequently to and just after the step of FIG. 6E. The step of FIG. 6F is the same as the step of FIG. 3H, and therefore will not be described in detail in repetition.

Embodiment 2 may be modified as in Embodiment 1.

Numeral improvements and alternative embodiments of the present invention will be conceived by those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

An aspect of the present invention is useful as a non-volatile memory device which can reduce a size of a memory cell, while reducing electric power consumption during writing to a selected memory element and attaining a higher-speed operation by arranging a bit line BL and a source line SL in parallel with each other.

REFERENCE SIGNS LIST 100 non-volatile memory device
101 substrate
102 main surface of substrate
103 first plane
104 first wire (control electrode)
105 second plane
106 second wire
107 fourth plane
108 third wire
110 memory cell
112 transistor
113 third plane
114 variable resistance element
115 protruding portion
116 first main electrode
118 second main electrode
120 lower electrode
122 variable resistance layer
124 upper electrode
126 first contact plug
128 second contact plug
129 contact hole
130 third contact plug
131 side wall insulating layer
131' insulating material layer
132 isolation region
134 first interlayer insulating layer
136 second interlayer insulating layer
138 third interlayer insulating layer
140 fourth interlayer insulating layer
142 active region
144 third contact plug
146 connection wire layer
148 fourth contact plug
200 non-volatile memory device
300 non-volatile memory device
400 non-volatile memory device

What is claimed is:

1. A non-volatile memory device comprising:
a substrate;
first wires extending in a first direction on and above a first plane parallel to a main surface of the substrate;
second wires extending in a second direction crossing the first direction, on and above a second plane which is parallel to the main surface of the substrate and more distant from the substrate than the first plane;
third wires extending in the second direction on and above a fourth plane which is parallel to the main surface of the substrate and more distant from the substrate than the second plane; and
memory cells provided to correspond to three-dimensional cross-points of the first wires and the third wires, respectively, wherein:
each of the memory cells includes one transistor and one variable resistance element,
the transistor is provided on and above the substrate, and includes a first main electrode, a second main electrode, and a control electrode,
the control electrode is connected to or integral with corresponding one of the first wires,
the variable resistance element is placed on and above a third plane which is parallel to the main surface of the substrate, more distant from the substrate than the second plane and closer to the substrate than the fourth plane, and the variable resistance element includes a lower electrode, an upper electrode and a variable resistance layer disposed between the lower electrode and the upper electrode, the upper electrode is connected to corresponding one of the third wires, the non-volatile memory device further comprises:
  a first contact plug extending from an upper end surface of the first main electrode to the second plane and connected to corresponding one of the second wires;
  a second contact plug extending from an upper end surface of the second main electrode to the second plane; and
  a third contact plug extending from an upper end surface of the second contact plug and connected to the lower electrode, and the second main electrode and the lower electrode are connected to each other via the second contact plug and the third contact plug.

2. The non-volatile memory device according to claim 1, wherein a plurality of variable resistance elements, each having an island shape, are arranged along the second direction such that the plurality of variable resistance elements correspond to one third wire.

3. The non-volatile memory device according to claim 1, wherein the variable resistance layer includes a plurality of metal oxide layers which are different in composition from each other.

4. The non-volatile memory device according to claim 1, wherein a space between the second wire and the third wire is set smaller than a line width of the second wire and a line width of the third wire, when viewed from a thickness direction of the substrate.

5. The non-volatile memory device according to claim 1, wherein the second wire has a protruding portion which overlaps with the third wire when viewed from a thickness direction of the substrate, and the first contact plug extends from an upper end surface of the first main electrode to a lower surface of the protruding portion.

6. The non-volatile memory device according to claim 1, wherein the transistor is configured such that the first main electrode and the second main electrode included in each transistor are arranged in parallel with the second direction, when viewed from a thickness direction of the substrate.

7. The non-volatile memory device according to claim 1, further comprising:
  a side wall insulating layer formed on a side surface of the third contact plug; and
  an interlayer insulating layer disposed between the second plane and the third plane and covering the side wall insulating layer.

8. The non-volatile memory device according to claim 1, wherein:
  an upper end surface of the first contact plug is in contact with a bottom surface of the corresponding one of the second wires, and
  an upper end surface of the third contact plug is in contact with a bottom surface of the lower electrode.

9. The non-volatile memory device according to claim 1, wherein a center of the first contact plug and a center of the second contact plug are not aligned along the second direction, in a plane view.

10. The non-volatile memory device according to claim 1, wherein a height of the first contact plug from the first plane is equal to a height of the second contact plug from the first plane.

11. A non-volatile memory device comprising:
  a word line extending in a first direction;
  a bit line extending in a second direction perpendicular to the first direction;
  a source line extending in the second direction; and
  a memory cell including one transistor and one variable resistance element, wherein:
  the one transistor includes a first main electrode, a second main electrode and a control electrode,
  the control electrode is connected to or integral with the word line,
  the variable resistance element is disposed in a layer above the bit line and below the source line,
  the variable resistance element includes a lower electrode, an upper electrode and a variable resistance layer disposed between the lower electrode and the upper electrode,
  the upper electrode is connected to the source line, and
  the memory cell further comprises:
    a contact plug C1 extending from an upper end surface of the first main electrode to a bottom surface of the bit line; and
    a contact plug C2 extending from an upper end surface of the second main electrode to a bottom surface of the lower electrode.

12. The non-volatile memory device according to claim 11, wherein:
  the contact plug C2 includes a lower contact plug and an upper contact plug, and
  a height of the lower contact plug is the same as a height of the contact plug C1.

13. The non-volatile memory device according to claim 11, wherein a plurality of variable resistance elements, each having an island shape, are arranged along the second direction such that the plurality of variable resistance elements are connected to the source line.

14. The non-volatile memory device according to claim 11, wherein the variable resistance layer includes a plurality of metal oxide layers which are different in composition from each other.

15. The non-volatile memory device according to claim 11, wherein:
  a space is provided between the bit line and the source line wire, and
  the space is set smaller than a line width of the bit line and a line width of the source line, in a plane view.

16. The non-volatile memory device according to claim 11, wherein:
  the bit line has a protruding portion which overlaps with the source line in a plane view, and
  the contact plug C1 extends from an upper end surface of the first main electrode to a lower surface of the protruding portion.

17. The non-volatile memory device according to claim 11, wherein the transistor is configured such that the first main electrode and the second main electrode included in each transistor are arranged in parallel with the second direction, in a plane view.

18. The non-volatile memory device according to claim 11, further comprising:
  a side wall insulating layer formed on a side surface of the third contact plug; and an interlayer insulating layer covering the side wall insulating layer.

19. The non-volatile memory device according to claim 11, wherein a center of the contact plug C1 and a center of the contact plug C2 are not aligned along the second direction, in a plane view.

* * * * *